United States Patent
Nakata et al.

(10) Patent No.: US 9,798,203 B2
(45) Date of Patent: Oct. 24, 2017

(54) SEMICONDUCTOR DEVICE AND DISPLAY DEVICE

(71) Applicant: Sharp Kabushiki Kaisha, Osaka-shi, Osaka (JP)

(72) Inventors: Yukinobu Nakata, Osaka (JP); Masaki Maeda, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 426 days.

(21) Appl. No.: 14/431,825

(22) PCT Filed: Sep. 25, 2013

(86) PCT No.: PCT/JP2013/075853
§ 371 (c)(1),
(2) Date: Mar. 27, 2015

(87) PCT Pub. No.: WO2014/054482
PCT Pub. Date: Apr. 10, 2014

(65) Prior Publication Data
US 2015/0241744 A1 Aug. 27, 2015

(30) Foreign Application Priority Data
Oct. 2, 2012 (JP) ................ 2012-220489

(51) Int. Cl.
*G02F 1/1362* (2006.01)
*H01L 27/12* (2006.01)
(Continued)

(52) U.S. Cl.
CPC ...... *G02F 1/136204* (2013.01); *G02F 1/1368* (2013.01); *G02F 1/136277* (2013.01); *G02F 1/136286* (2013.01); *H01L 21/768* (2013.01); *H01L 27/0292* (2013.01); *H01L 27/0296* (2013.01); *H01L 27/1225* (2013.01);
(Continued)

(58) Field of Classification Search
CPC ................................ G02F 1/136204
See application file for complete search history.

(56) References Cited

U.S. PATENT DOCUMENTS

| 6,081,307 A | 6/2000 | Ha | |
|---|---|---|---|
| 2006/0043447 A1* | 3/2006 | Ishii | H01L 29/41733 257/295 |
| 2007/0273801 A1* | 11/2007 | Hwang | G02F 1/136204 349/40 |

FOREIGN PATENT DOCUMENTS

JP 2010-230744 A 10/2010

* cited by examiner

*Primary Examiner* — Nathanael R Briggs
*Assistant Examiner* — Alexander Gross
(74) *Attorney, Agent, or Firm* — Keating & Bennett, LLP

(57) ABSTRACT

The array board 11b includes a first diode 29, a common line 25, a first shorting line 31, and the static protection portion 51. The first diode 29 include at least the first semiconductor portion 29d having outer edges 29d1 that cross the outer edges 29a1, 29b1 of first electrodes 29a, 29b in a plan view. The common line 25 is formed from the first metal film 34. The first shorting line 31 is formed from the second metal film 38 and crosses the common line 25. The static protection portion 51 is formed from the second metal film 38 or the protection film 37. At least a portion of the static protection portion 51 overlaps the common line 25 in a plan view. The static protection portion 51 is arranged closer to the first diode 29 than an intersection CPT of the common line 25 and the first shorting line 31. The static protection portion 51 includes at least a static dissipating portion 52 for dissipating static.

20 Claims, 24 Drawing Sheets

(51) Int. Cl.

| | |
|---|---|
| *H01L 27/02* | (2006.01) |
| *G02F 1/1368* | (2006.01) |
| *H01L 21/768* | (2006.01) |
| *H01L 29/24* | (2006.01) |
| *H01L 29/786* | (2006.01) |
| *G02F 1/1343* | (2006.01) |
| *G02F 1/1345* | (2006.01) |

(52) U.S. Cl.
CPC .......... *H01L 27/1259* (2013.01); *H01L 29/24* (2013.01); *H01L 29/7869* (2013.01); *H01L 29/78606* (2013.01); *G02F 1/13452* (2013.01); *G02F 1/13454* (2013.01); *G02F 2001/134372* (2013.01); *G02F 2201/40* (2013.01); *H01L 27/124* (2013.01)

SEMICONDUCTOR DEVICE AND DISPLAY DEVICE

TECHNICAL FIELD

The present invention relates to a semiconductor device and a display device.

BACKGROUND ART

A liquid crystal panel in a liquid crystal display device includes TFTs arranged in a matrix. The TFTs are switching components for controlling operations of pixels. Silicon semiconductors such as amorphous silicon semiconductors have been used for semiconductor films of the TFTs. In recent years, use of oxide semiconductors having higher electron mobility for semiconductor films has been proposed. An example of a liquid crystal display device including TFTs using such oxide semiconductors as switching components is disclosed in Patent Document 1.

RELATED ART DOCUMENT

Patent Document

Patent Document 1: Japanese Unexamined Patent Application Publication No. 2010-230744

Problem to be Solved by the Invention

An oxide semiconductor has high electron mobility. Therefore, sizes of TFTs can be reduced and an aperture ratio of a liquid crystal panel can be increased. Furthermore, various circuits can be arranged on an array board on which the TFTs are disposed. However, if circuits are disposed on the array board, voltages caused by static may be applied to the circuits in a fabrication process. This may cause malfunctions of the circuits.

DISCLOSURE OF THE PRESENT INVENTION

The present invention was made in view of the above circumstances. An object is to provide technology for reducing malfunctions due to static.

Means for Solving the Problem

A semiconductor device according to the present invention includes a substrate, a first metal film, an insulation film, a semiconductor film, a protection film, a second metal film, a semiconductor component, a static dissipating line, a semiconductor component connecting line, and a static protection portion. The first metal film is formed on the substrate. The insulation film is formed on at least the first metal film. The semiconductor film is formed on the insulation film. The protection film is formed on at least the semiconductor film and protects the semiconductor film. The second metal film is formed on the protection film. The semiconductor component includes at least two electrodes, a protection portion, and a semiconductor portion. The electrodes are formed from the second metal film. The protection portion is formed from the protection film and includes two semiconductor component-side holes that are through holes formed at positions overlapping the electrodes, respectively. The semiconductor portion is formed from the semiconductor film and connected to the electrodes via the semiconductor component-side holes, respectively. The semiconductor portion includes outer edges that cross outer edges of the electrodes in a plan view. The static dissipating line is formed from the first metal film and arranged adjacent to the semiconductor component in a plan view. The static dissipating line extends along a plate surface of the substrate and along a direction that crosses an arrangement direction of the electrodes. The static dissipating line is configured to dissipate static. The semiconductor component connecting line is formed from the second metal film. The semiconductor component connecting line continues from one of the electrodes and extends along the plate surface of the substrate and along the arrangement direction of the electrodes so as to cross the static dissipating line. The static protection portion includes at least a static dissipating portion formed from the second metal film or the semiconductor film. The static protection portion is arranged closer to the semiconductor component than an intersection of the static dissipating line and the semiconductor component connecting line such that at least a portion of the static dissipating portion overlaps the static dissipating line in a plan view. The static protection portion is configured to dissipate static.

As described above, the semiconductor component includes the semiconductor portion that is connected to the electrodes and includes the outer edges that cross the outer edges of the electrodes in a plan view. Coverage of the insulation film arranged in the lower layer decreases at the intersections of the outer edges of the semiconductor portion and the outer edges of the electrodes and thus insulating performance decreases. Static that is built up in the fabrication process of the semiconductor device may be applied to the intersections. At the position adjacent to the semiconductor component in a plan view, the static dissipating line is arranged. The static dissipating line is formed from the first metal film and extends along the plate surface of the substrate and along the direction perpendicular to the arrangement direction of the electrodes. Furthermore, the static dissipating portion is arranged such that at least a portion of the static dissipating portion overlaps the static dissipating line in a plan view. The static dissipating portion is formed from the second metal film or the semiconductor film. According to this configuration, coverage of the insulation film between the static dissipating portion and the static dissipating line decreases in some areas and thus insulating performance decreases. Therefore, even if static is built up in the fabrication process of the semiconductor device, the static is dissipated to the static dissipating portion and thus the static is less likely to be directly applied to the semiconductor component. Furthermore, the static dissipating portion in the static protection portion is formed from the second metal film, continues from one of the electrodes, and arranged closer to the semiconductor component than the intersection of the semiconductor component connecting line that extends along the arrangement direction of the electrodes and the static dissipating line. Therefore, the static that may be applied to the semiconductor component is more properly dissipated and thus the static is further less likely to be directly applied to the semiconductor component.

Preferable embodiments may include the following configurations.

(1) The semiconductor film may be made of oxide semiconductor. The semiconductor film made of oxide semiconductor is more likely to be etched during formation of the second metal film in the fabrication process. After the formation of the second metal film, oxidation or reduction of the semiconductor film is more likely to occur. However, the protection film is disposed between the semiconductor film and the second metal film and the semiconductor film is protected by the protection film. Therefore, the semiconductor film is less likely to be etched during the formation of the second metal film and the oxidation or the reduction thereof is less likely to occur after the formation of the second metal film.

(2) The static dissipating portion may be formed from the semiconductor film. According to this configuration, the coverage of the insulation film arranged under the static dissipating portion decreases and thus the static dissipating effect increases. In comparison to a configuration in which the static dissipating portion is formed from the second metal film, even if the static dissipating line in the lower layer does not have a sufficient line width, the static dissipating line in the static dissipating portion that is formed from the semiconductor film is less likely to be shorted. Therefore, yield improves.

(3) The static protection portion may include a second static dissipating portion formed from the second metal film and arranged such that at least a portion thereof overlaps the static dissipating portion in a plan view. The second static dissipating portion may include outer edges that cross outer edge of the static dissipating portion. The second static dissipating portion includes the outer edges that cross the outer edges of the static dissipating portion in a plan view. According to this configuration, the coverage of the protection film and the insulation film arranged in the lower layers decreases at the intersections of the outer edges of the second static dissipating portion and the static dissipating portion and the insulating performance decreases. Therefore, the static is dissipated to the intersections. The static is further less likely to be directly applied to the semiconductor component.

(4) The static dissipating portion may have a rectangular shape in a plan view. The second static dissipating portion may be arranged such that the outer edges thereof cross the outer edges of the static dissipating portion at least at four points. Because the outer edges of the static dissipating portion having the rectangular shape in a plan view cross the outer edges of the second static dissipating portion at least at four points, the static that may be applied to the semiconductor component is further properly dissipated. According to this configuration, the static is further less likely to be directly applied to the semiconductor component.

(5) The second static dissipating portion may include at least four outer edges parallel to four outer edges of the static dissipating portion, respectively. A distance between the outer edges of the second static dissipating portion parallel to each other may be different from a distance between the outer edges of the static dissipating portion parallel to each other. According to this configuration, a shape of the second static dissipating portion in a plan view is simple. Therefore, advantageous effects including a preferable yield rate in production can be achieved.

(6) The semiconductor device may further include a second semiconductor component, a second semiconductor component connecting line-side insulator, and a static dissipating line-side connecting portion. The second semiconductor component connecting line may be formed from the second metal film and continue from another one of the electrodes of the semiconductor component. The second semiconductor component connecting line-side insulator may be formed from the insulation film and the protection film. The second semiconductor component connecting line-side insulator may include a second semiconductor component connecting line-side hole that is a through hole formed at a position overlapping the second semiconductor component connecting line in a plan view. The static dissipating line-side connecting portion may be formed from the first metal film. The static dissipating line-side connecting portion may continue from the static dissipating line. The static dissipating line-side connecting portion may be arranged such that at least a portion thereof overlaps the second semiconductor component connecting line in a plan view and connected to the second semiconductor component connecting line via the second semiconductor component connecting line-side hole. According to this configuration, one of the electrodes in the semiconductor component is connected to the semiconductor component connecting line and the other one of the electrodes is connected to the second semiconductor component connecting line. The second semiconductor component connecting line is connected to the static dissipating line-side connecting portion that continues from the static dissipating line via the second semiconductor component connecting line-side hole. If a potential at the semiconductor component connecting line becomes higher than the static dissipating line, a current is routed to the static dissipation line via the semiconductor portion in the semiconductor component. This compensates the potential difference.

(7) The semiconductor device may further include a second semiconductor component. The second semiconductor component may include at least two second electrodes, a second protection portion, and a second semiconductor portion. The second electrodes may be formed from the second metal film. The second protection portion may be formed from the protection film and include two second semiconductor component-side holes that are through holes formed at positions overlapping the second electrodes. The second semiconductor portion may be formed from the second protection portion and the semiconductor film and connected to the second electrodes via the second semiconductor component-side holes, respectively. The semiconductor component connecting line may short out one of the electrodes to one of the second electrodes. The second semiconductor component connecting line may short out the other one of the electrodes to the other one of the second electrodes. Regarding the semiconductor component and the second semiconductor component, the one of the electrodes and the one of the second electrodes may be shorted out by the semiconductor component connecting line and the other one of the electrodes and the other one of the second electrodes may be shorted out by the second semiconductor component connecting line. If static causes a significant potential difference occurs between the static dissipating line and the semiconductor component connecting line, a current is routed to the semiconductor portion of the semiconductor component or the second semiconductor portion of the second semiconductor component. This compensates the potential difference.

(8) The semiconductor device may further include a gate electrode-side insulator, a gate electrode, a second gate electrode-side insulator, and a second gate electrode. The gate electrode-side insulator may be formed from the protection film and the insulation film. The gate electrode-side insulator may include a gate electrode-side hole that is a through hole formed at a position overlapping the semiconductor component connecting line. The gate electrode may be included in the semiconductor component and formed from the first metal film. The gate electrode may be arranged so as to overlap at least portions of the electrodes, the semiconductor portion, and the semiconductor component connecting line in a plan view. The gate electrode may be connected to the semiconductor component connecting line via the gate electrode-side hole. The second gate electrode-side insulator may be formed from the protection film and the insulation film. The second gate electrode-side insulator may include a second gate electrode-side hole that is a through hole formed at a position overlapping the semiconductor component connecting line. The second gate electrode may be includes in the second semiconductor component and formed from the first metal film. The second gate electrode may be arranged so as to overlap at least portions of the second electrodes, the second semiconductor portion, and the second semiconductor component connecting line in a plan view. The second gate electrode may be connected to the second semiconductor component connecting line via the second gate electrode-side hole. The gate electrode is shorted out to one of the electrodes and one of the second electrodes by the semiconductor component connecting line. The second gate electrode is shorted out to the other one of the electrodes and the other one of the second electrodes by the second semiconductor component connecting line. The semiconductor component and the second semiconductor component are configured as diodes having transistor configurations. However, with a threshold voltage set higher than a signal transmitted through the signal line but lower than a voltage applied when static builds up, the static is dissipated to the static dissipating line only if the static builds up. Furthermore, the second gate electrode is indirectly connected to the static dissipating line-side connecting portion via the second semiconductor component connecting line. In comparison to a configuration in which the second electrode is directly connected to the static dissipating line-side connecting portion, malfunctions of the semiconductor component and the second semiconductor component due to static drawn to the static dissipating portion are less likely to occur.

(9) The semiconductor device may further include a signal line, a signal line-side connecting portion, a contact portion-side insulator, and a contact portion. The signal line may be formed from the first metal film and arranged on an opposite side from the static dissipating line with respect to the semiconductor component. The signal line-side connecting portion may be formed from the first metal film and at an end of the signal line. The contact portion-side insulator may be formed from the protection film and the insulation film. The contact portion-side insulator may include a contact portion-side hole that is a through hole formed at a position overlapping the signal line-side connecting portion. The contact portion may be formed from the second metal film. The contact portion may include at least a semiconductor component-side connecting portion formed at an end of the semiconductor component connecting line so as to overlap the signal-line side connecting portion in a plan view and connected to the signal line-side connecting portion via the contact portion-side hole. The signal line-side connecting portion may be formed at an end of the signal line formed from the first metal film. The semiconductor component-side connecting portion may be formed from the second metal film and at an end of the semiconductor component connecting line that may continue from one of the electrodes in the semiconductor component. The signal line-side connecting portion is connected to the semiconductor component-side connecting portion via the contact portion-side hole that is a through hole formed in the contact portion-side insulator in the contact portion. According to this configuration, signals from the semiconductor component are transmitted to the signal line.

(10) The semiconductor device may further include static dissipating projections formed at portions of the signal line-side connecting portion in the contact portion and the static dissipating line opposed to each other so as to project toward each other to dissipate static. In the fabrication process of the semiconductor device, even if static is built up in one of the semiconductor component and the contact portion, the static is dissipated to the static dissipating projection in a path toward the other one of the semiconductor component and the contact portion. With this configuration, a malfunction due to the static in the semiconductor component or the contact portion is further less likely to occur.

(11) The semiconductor device may further include a gate electrode-side insulator, a gate electrode, and a gate non-overlapping-type static dissipating portion. The gate electrode-side insulator may be formed from the protection film and the insulation film. The gate electrode-side insulator may include a gate electrode-side hole that is a through hole formed at a position overlapping the semiconductor component connecting line. The gate electrode may be included in the semiconductor component and formed from the first metal film. The gate electrode may be arranged so as to overlap at least portions of the electrodes, the semiconductor portion, and the semiconductor component connecting line in a plan view. The gate electrode may be connected to the semiconductor component connecting line via the gate electrode-side hole. The gate non-overlapping-type static dissipating portion may continue from the semiconductor portion and include an outer edge that crosses an outer edge of the other one of the electrodes in a plan view at a position that does not overlap the gate electrode in a plan view. At the intersection of the other one of the outer edges of the electrodes in the semiconductor component and the outer edge of the gate non-overlapping-type static dissipating portion that is formed from the semiconductor film in a plan view, the coverage of the protection film and the insulation film arranged in the lower layers decreases and the insulating performance decreases. Therefore, the static is can be dissipated to the intersection. The intersection of the outer edge of the other one of the electrodes and the outer edge of the gate non-overlapping-type static dissipating portion is at a position that does not overlap the gate electrode in a plan view. Even if the static is applied to the intersection, the other one of the electrodes and the gate electrode are less likely to be shorted out.

Next, to resolve the problem described earlier, a display device according to the present invention includes the semiconductor device that is described above, a counter substrate, a liquid crystal layer, and a switching component. The counter substrate is arranged opposite the semiconductor device. The liquid crystal layer is arranged between the semiconductor device and the counter substrate. The switching component is included in the semiconductor device and connected to at least the semiconductor component.

According to the display device, a malfunction of the semiconductor device due to static is less likely to occur. Namely, the display device has high operation reliability.

Advantageous Effect of the Invention

According to the present invention, a malfunction due to static is less likely to occur.

MODE FOR CARRYING OUT THE INVENTION

First Embodiment

Figure 1:
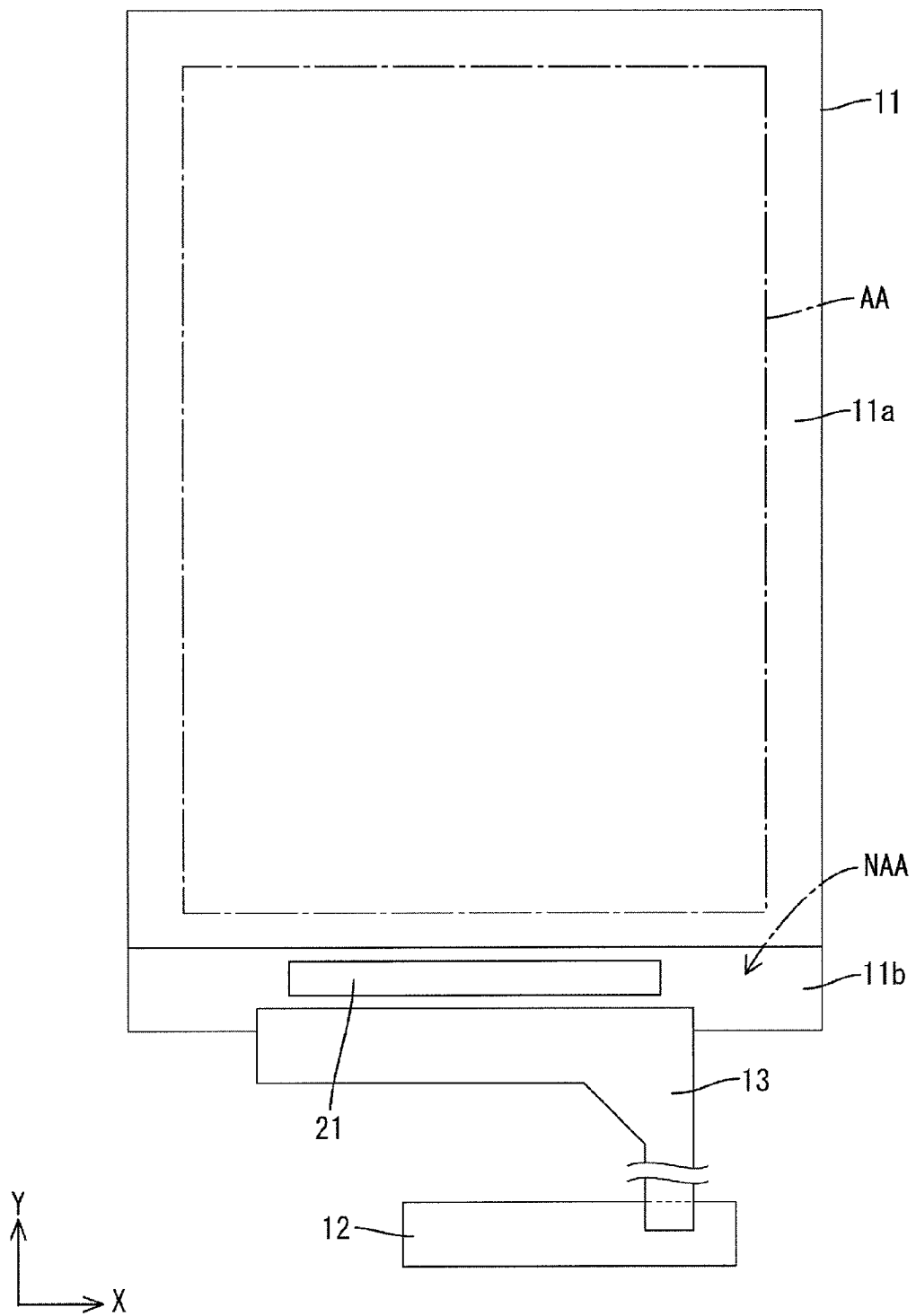
FIG. 1 is a schematic plan view of a liquid crystal panel on which a driver is mounted, a flexible printed circuit board, and a control circuit board according to a first embodiment illustrating connection among those.

A first embodiment will be described with reference to FIGS. 1 to 14. A liquid crystal display device 10 according to this embodiment will be described. X-axis, Y-axis and Z-axis may be indicated in the drawings. The axes in each drawing correspond to the respective axes in other drawings. The vertical direction is defined based on FIG. 2. An upper side and a lower side in FIG. 2 correspond to a front side and a back side of the liquid crystal display device 10, respectively.

Figure 2:
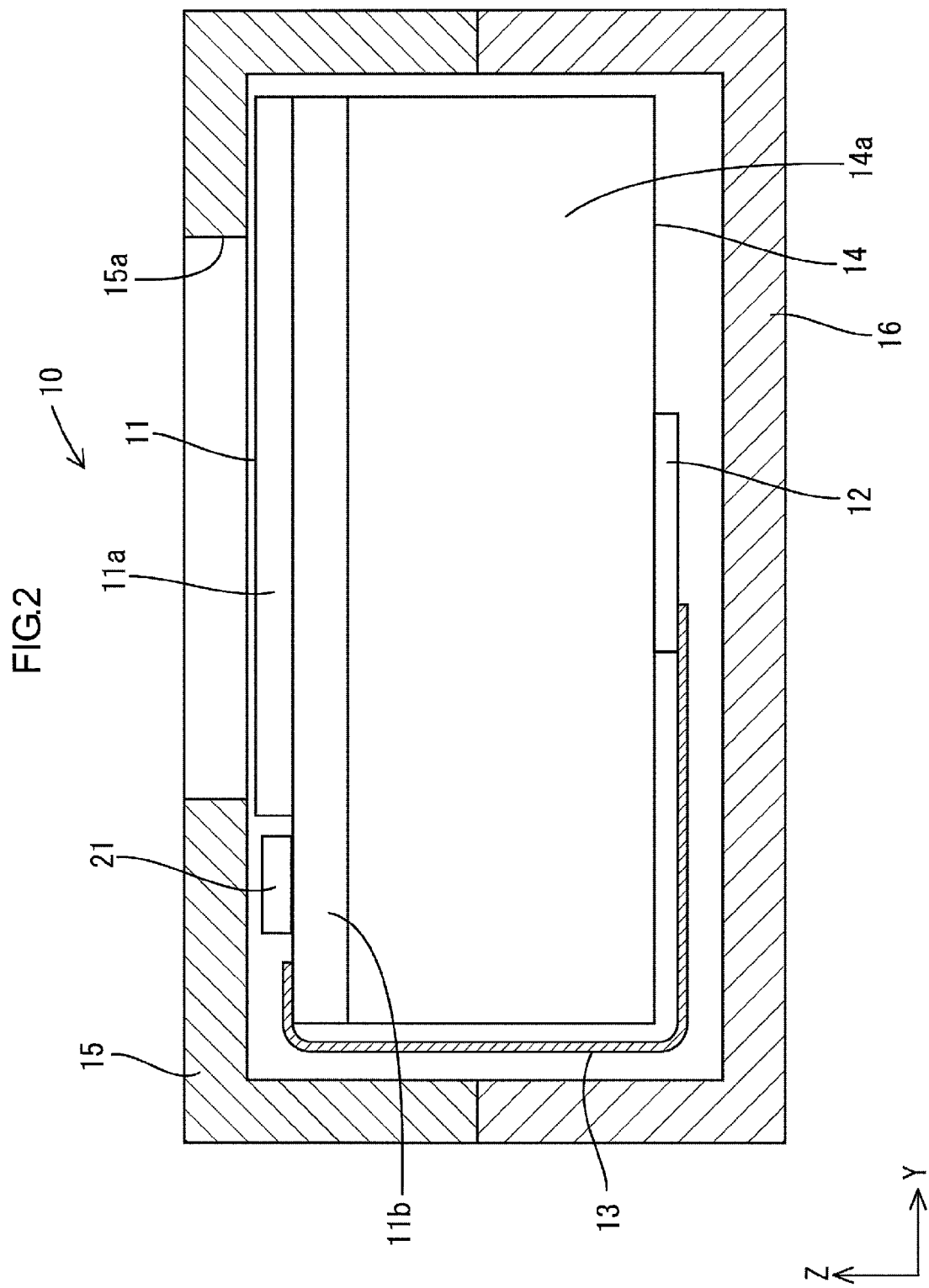
FIG. 2 is a schematic cross-sectional view of a liquid crystal display device illustrating a cross-sectional configuration along a long-side direction thereof.

As illustrated in FIGS. 1 and 2, a liquid crystal display device 10 includes a liquid crystal panel (a display device) 11, a driver (a panel driver) 21, a control circuit board (an external signal source) 12, a flexible printed circuit board (an external connector) 13, and a backlight unit (a backlight device) 14. The liquid crystal panel 11 includes a display area AA in which images are displayed and a non-display area NAA outside the display area AA. The driver 21 is configured to drive the liquid crystal panel 11. The control circuit board 12 is configured to supply various input signals to the driver 21 from the outside. The flexible printed circuit board 13 electrically connects the liquid crystal panel 11 to the control circuit board 12 outside the liquid crystal panel 11. The backlight unit 14 is an external light source for supplying light to the liquid crystal panel 11. The liquid crystal display device 10 further includes a pair of exterior components 15 and 16 that are front and rear components used in a pair to hold the liquid crystal panel 11 and the backlight unit 14 that are attached together. The exterior component 15 on the front has an opening 15a through which images displayed in the display area AA of the liquid crystal panel 11 are viewed from the outside. The liquid crystal display device 10 according to this embodiment may be used in various kinds of electronic devices (not illustrated) such as handheld terminals (including electronic books and PDAs), mobile phones (including smartphones), notebook computers (including tablet computers), digital photo frames, portable video game players, and electronic-ink papers. The liquid crystal panel 11 in the liquid crystal display device 10 is in a range between some inches to ten and some inches. Namely, the liquid crystal panel 11 is in a size that is classified as a small or a small-to-medium.

The backlight unit 14 will be described. As illustrated in FIG. 2, the backlight unit 14 includes a chassis 14a, light sources (e.g., cold cathode fluorescent tubes, LEDs, organic ELs), an optical member. The chassis 14a has a box-like shape with an opening on the front (on a liquid crystal panel 11 side). The light sources, which are not illustrated, are disposed inside the chassis 14a. The optical member, which is not illustrated, is arranged so as to cover the opening of the chassis 14a. The optical member has a function to convert light from the light sources into planar light.

Next, the liquid crystal panel 11 will be described. As illustrated in FIG. 1, the liquid crystal panel 11 has a vertically-long rectangular overall shape. The liquid crystal panel 11 includes a display area (an active area) AA that is off centered toward one of ends of a long dimension thereof (the upper side in FIG. 1). The driver 21 and the flexible printed circuit board 13 are arranged at the other end of the long dimension of the liquid crystal panel 11 (the lower side in FIG. 1). An area of the liquid crystal panel 11 outside the display area AA is a non-display area (non-active area) NAA in which images are not displayed. The non-display area NAA includes a frame-shaped area around the display area AA (a frame portion of a CF board 11a, which will be described later) and an area provided at the other end of the long dimension of the liquid crystal panel 11 (an exposed area of an array board 11b which does not overlap the CF board 11a, which will be described later). The area provided at the other end of the long dimension of the liquid crystal panel 11 includes amounting area (an attachment area) in which the driver 21 and the flexible printed circuit board 13 are mounted. A short-side direction and a long-side direction of the liquid crystal panel 11 correspond to the X-axis direction and the Y-axis direction in each drawing. In FIG. 1, a chain line box slightly smaller than the CF board 11a indicates a boundary of the display area AA. An area outside the solid line is the non-display area NAA.

Next, the components connected to the liquid crystal panel 11 will be described. As illustrated in FIGS. 1 and 2, the control circuit board 12 is mounted to the back surface of the chassis 14a (an outer surface on a side opposite from the liquid crystal panel 11) of the backlight unit 14 with screws. The control circuit board 12 includes a substrate made of paper phenol or glass epoxy resin and electronic components mounted on the substrate and configured to supply various input signals to the driver 21. Traces (electrically conductive paths) which are not illustrated are formed in predetermined patterns. An end of the flexible printed circuit board 13 is electrically and mechanically connected to the control circuit board 12 via an anisotropic conductive film (ACF), which is not illustrated.

The flexible printed circuit board (an FPC board) 13 includes a base member made of synthetic resin having insulating property and flexibility (e.g., polyimide resin). A number of traces are formed on the base member (not illustrated). As illustrated in FIG. 2, the end of the long dimension of the flexible printed circuit board 13 is connected to the control circuit board 12 disposed on the back surface of the chassis 14a as described above. The other end of the long dimension of the flexible printed circuit board 13 is connected to the array board 11b in the liquid crystal panel 11. The flexible printed circuit board 13 is bent or folded back inside the liquid crystal display device 10 such that a cross-sectional shape thereof forms a U-like shape. At the ends of the long dimension of the flexible printed circuit board 13, portions of the traces are exposed to the outside and configured as terminals (not illustrated). The terminals are electrically connected to the control circuit board 12 and the liquid crystal panel 11. With this configuration, input singles supplied by the control circuit board 12 are transmitted to the liquid crystal panel 11.

As illustrated in FIG. 1, the driver 21 is on an LSI chip including drive circuits. The driver 21 is configured to operate according to signals supplied by the control circuit board 12, which is a signal source, to process the input signal supplied by the control circuit board 12, to generate output signals, and to output the output signals to the display area AA in the liquid crystal panel 11. The driver 21 has a vertically-long rectangular shape (an elongated shape that extends along the short side of the liquid crystal panel 11) in a plan view. The driver 21 is directly connected to the non-display area NAA of the liquid crystal panel 11 (or the array board 11b, which will be described later), that is, mounted by the chip-on-glass (COG) mounting method. A long-side direction and a short-side direction of the driver 21 correspond to the X-axis direction (the short-side direction of the liquid crystal panel 11) and the Y-axis direction (the long-side direction of the liquid crystal panel 11), respectively.

Figure 3:
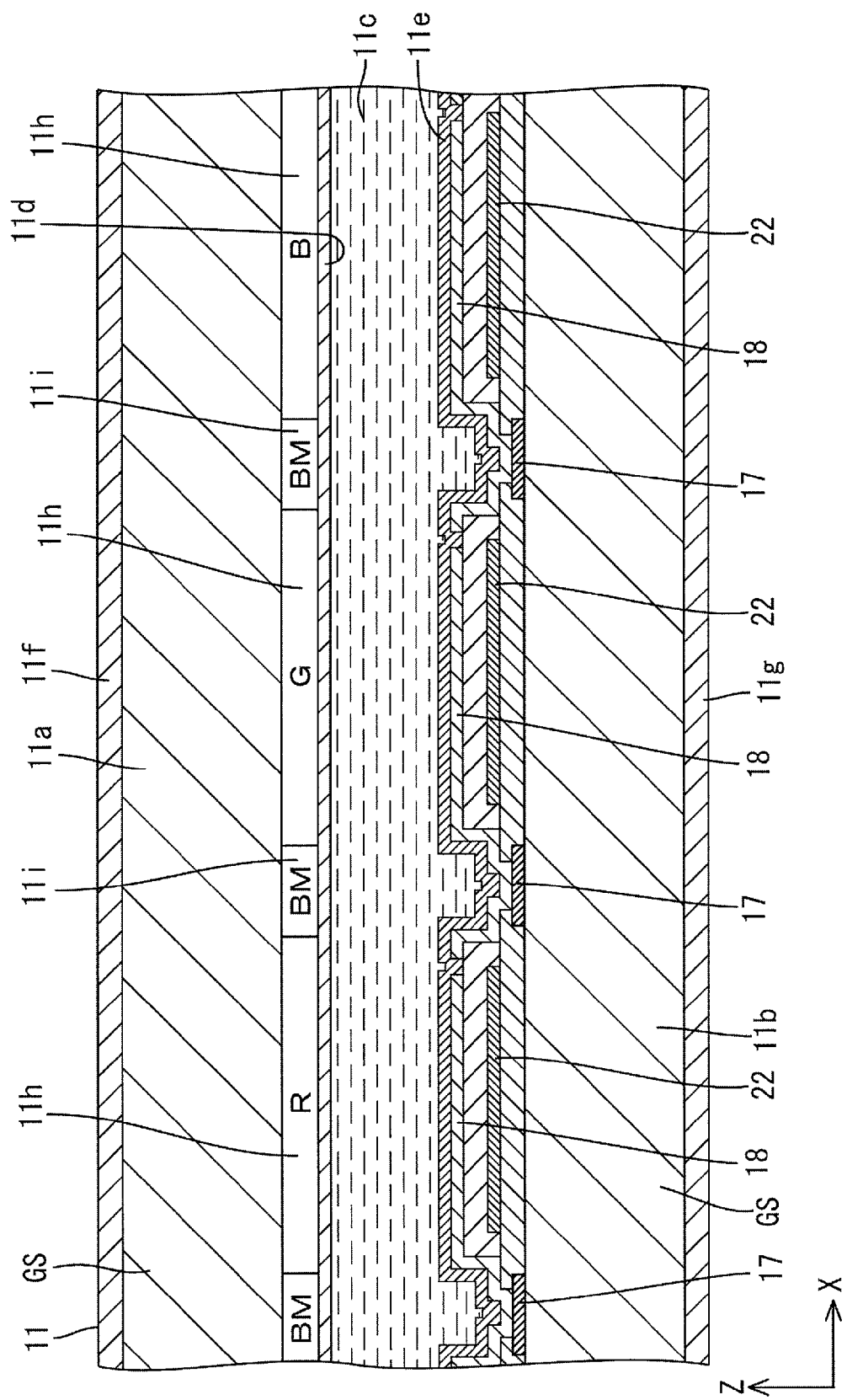
FIG. 3 is a schematic cross-sectional view illustrating a cross-sectional configuration of the liquid crystal panel.

The liquid crystal panel 11 will be described in more detail. As illustrated in FIG. 3, the liquid crystal panel 11 includes a pair of substrates 11a and 11b and a liquid crystal layer 11c between the substrates 11a and 11b. The liquid crystal layer 11c includes liquid crystal molecules having optical characteristics that vary according to application of electric field. The substrates 11a and 11b are bonded together with a sealing agent, which is not illustrated, with a gap therebetween. A size of the gap corresponds to the thickness of the liquid crystal layer 11c. The liquid crystal panel 11 in this embodiment operates in fringe field switching (FFS) mode that is a mode improved from an in-plane switching (IPS) mode. On one of the substrates 11a and 11b, specifically, on the array board 11b, pixel electrodes (second transparent electrodes) 18 and common electrodes (first transparent electrodes) 22, which will be described later, are formed. The pixel electrodes 18 and the common electrodes 22 are formed in different layers. One of the substrates 11a and 11b on the front is the CF board (a counter substrate) 11a and one on the rear (on the back) is the array board (a semiconductor device) 11b. The CF board 11a and the array board 11b include glass substrates GS that are substantially transparent (i.e., having high light transmissivity). Various films are formed in layers on each glass substrate GS. As illustrated in FIGS. 1 and 2, the CF board 11a has a short dimension substantially equal to that of the array board 11b and a long dimension smaller than that of the array board 11b. The CF board 11a is bonded to the array board 11b with one of ends of the long dimension (the upper end in FIG. 1) aligned with a corresponding edge of the array board 11b. A predetermined area of the other end of the long dimension of the array board 11b (the lower end in FIG. 1) does not overlap the CF board 11a and front and back plate surfaces in the area are exposed to the outside. The mounting area in which the driver 21 and the flexible printed circuit board 13 are mounted is provided in this area. Alignment films 11d and 11e are formed on inner surfaces of the substrates 11a and 11b, respectively, for alignment of the liquid crystal molecules included in the liquid crystal layer 11c. Polarizing plates 11f and 11g are attached to outer surfaces of the substrates 11a and 11b, respectively.

Figure 4:
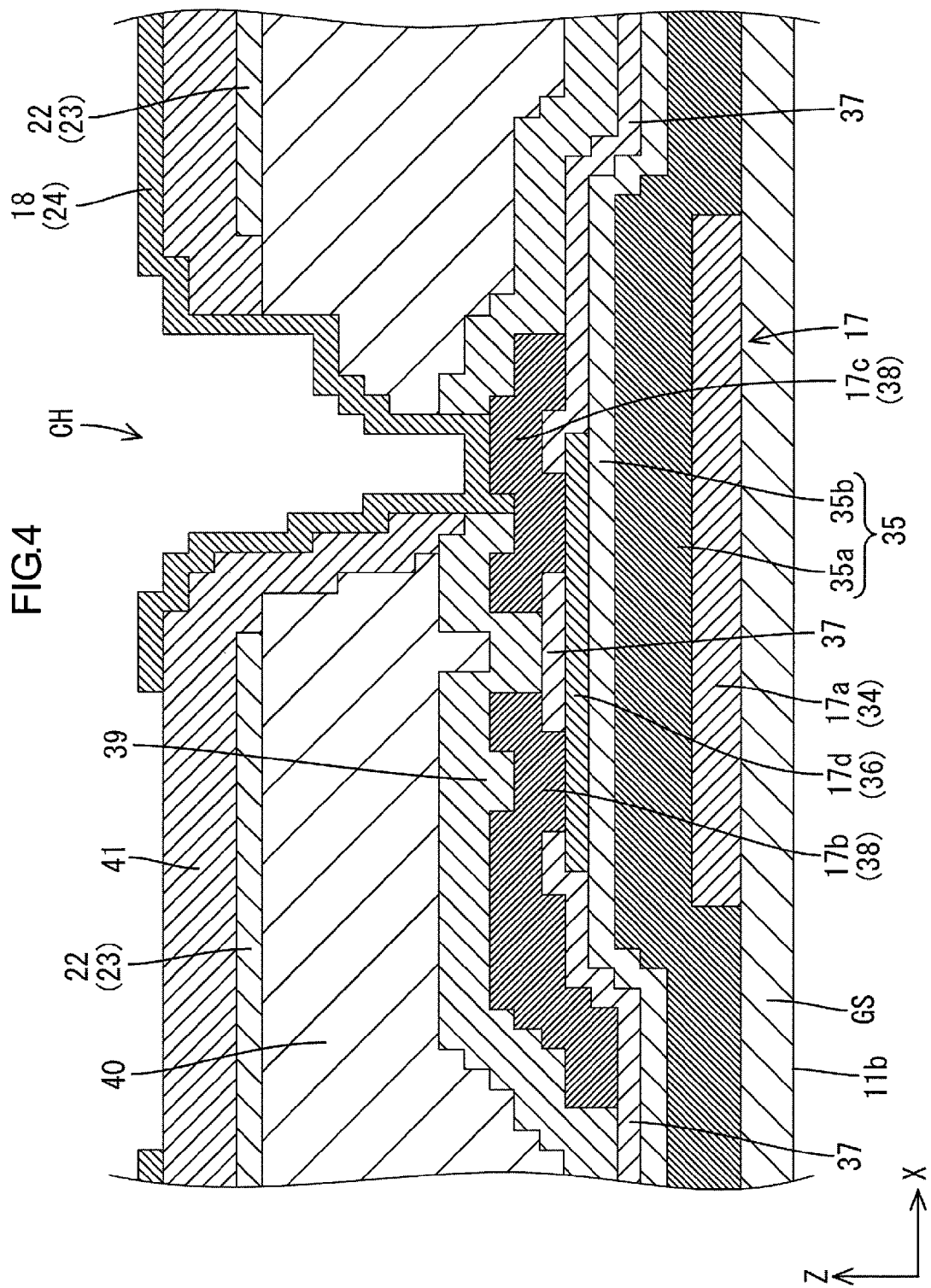
FIG. 4 is a cross-sectional view of a TFT in a display area of an array board illustrating a cross-sectional configuration thereof.

The films formed in layers on the inner surface of the array board 11b (on the liquid crystal layer 11c side, a surface opposite the CF board 11a) by a known photolithography method will be described. As illustrated in FIG. 4, on the array board 11b, the following films are formed in the following sequence from the lowest layer (the grass substrate GS): a first metal film (a gate metal film) 34, a gate insulator (an insulation film) 35, a semiconductor film 36, a protection film 37, a second metal film (a source metal film) 38, a first interlayer insulation film 39, an organic insulation film 40, a first transparent electrode film 23, a second interlayer insulation film 41, and a second transparent electrode film 24.

The first metal film 34 is a multilayered film of titanium (Ti) and copper (Cu). The first metal film 34 forms gate lines 19 and gate electrodes 17a of TFTs 17, which will be described later, in the display area AA. The first metal film 34 forms a common line 25 and ends of the gate lines (gate line-side connecting portions 48), and portions of diodes 29 and 30 (gate electrodes 29e and 30e) in a static protection circuit portion 26, which will be described later, in the non-display area NAA. The gate insulator 35 is a multilayered film that includes a lower gate insulator 35a that contains silicon nitride ($SiN_x$) and an upper gate insulator 35b that contains of silicon oxide ($SiO_2$). The semiconductor film 36 is an oxide thin film that is a kind of oxide semiconductors containing indium (In), gallium (Ga), and zinc (Zn). The oxide semiconductor that contains indium (In), gallium (Ga), and zinc (Zn), that is, the semiconductor film 36 may be amorphous or crystalline. In the display area AA, the semiconductor film 36 forms a channel 17d of each TFT 17, which will be described later. In the non-display area NAA, the semiconductor film 36 forms portions of the diodes 29 and 30 in the static protection circuit portion 26 (semiconductors 29d and 30d), which will be described later. The protection film 37 contains silicon oxide ($SiO_2$).

The second metal film 38 is a layered film that contains titanium (Ti) and copper (Cu). The second metal film 38 forms source lines 20 and source electrodes 17b and drain electrodes 17c of the TFTs 17, which will be described later, in the display area AA. The second metal film 38 forms a first shorting line 31, a second shorting line 33, and portions of the diodes 29 and 30 (electrodes 29a, 30a, 29b and 30b) in the static protection circuit portion 26, which will be described later, in the non-display area NAA. The first interlayer insulation film 39 contains silicon oxide ($SiO_2$). The organic insulation film 40 contains acrylic resin (e.g., polymethyl methacrylate (PMMA) and polyimide resin), which is an organic material. The first transparent electrode film 23 and the second transparent electrode film 24 are made of transparent electrode material such as indium tin oxide (ITO) and zinc oxide (ZnO). The second interlayer insulation film 41 contains silicon nitride (SiNx). The first transparent electrode film 23 and the second transparent electrode film 24 among the films are formed only in the display area AA of the array board 11b, that is, are not formed in the non-display area NAA. The insulation films made of insulating materials including the gate insulator 35, the protection film 37, the first interlayer insulation film 39, the organic insulation film 40, and the second interlayer insulation film 41 are formed in solid patterns arranged in a whole area of the surface of the array board 11b. The first metal film 34, the semiconductor film 36, and the second metal film 38 are formed in predetermined patterns in the display area AA and the non-display area NAA of the array board 11b.

Next, configurations of components in the display area AA of the array board 11b will be described in sequence. As illustrated in FIG. 3, in the display area AA of the array board 11b, the thin film transistors (TFTs) 17, which are switching components, and pixel electrodes 18 are disposed in a matrix. Furthermore, gate lines (signal lines, row control lines, scanning lines) 19 and source lines (column control lines, data lines) 20 are routed in a matrix such that each pair of the TFT 17 and the pixel electrode 18 is in a cell defined by the gate lines 19 and the source lines 20. Namely, the TFTs 17 and the pixel electrodes 18 are arranged in a matrix at respective corners defined by the gate lines 19 and the source lines 20 that are formed in a matrix. The first metal film 34 forms the gate lines 19 and the second metal film 38 forms the source lines 20. The gate insulator 35 and the protection film 37 are arranged between the gate line 19 and the source line 20 at an intersection thereof. As illustrated in FIG. 4, the gate lines 19 and the source lines 20 are connected to first gate electrodes 17a and first source electrodes 17b of the respective TFTs 17, respectively. The pixel electrodes 18 are connected to first drain electrodes 17c of the respective TFTs 17. Each TFT 17 includes a first channel 17d that is formed from the semiconductor film 36. The first channel 17d bridges the first source electrode 17b and the first drain electrode 17c so that electrons move between the source electrode 17b and the drain electrode 17c. The semiconductor film 36 that forms the first channel 17d is an oxide thin film that contains indium (In), gallium (Ga), and zinc (Zn). The oxide thin film that contains indium (In), gallium (Ga), and zinc (Zn) has electron mobility higher than that of an amorphous silicon film, for example, 20 to 50 times higher. Therefore, the TFTs 17 can be easily downsized and an amount of transmitted light through each pixel electrode 18 can be increased to a maximum level. This configuration is preferable for enhancement of image resolution and reduction of power consumption. Each TFT 17 including such an oxide thin film that contains indium (In), gallium (Ga), and zinc (Zn) is an inverted-staggered type having a configuration in which the first gate electrode 17a is arranged at the bottom and the first channel 17d is arranged thereon via the gate insulator 35. A stacking structure of the TFT 17 is similar to that of a TFT including a common amorphous silicon thin film. Because the oxide thin film that contains indium (In), gallium (Ga), and zinc (Zn) is an oxide, it is subject to oxidation or reduction. Furthermore, the oxide thin film is subject to etching during etching in formation of the source electrodes 17b and the drain electrodes 17c. Each TFT 17 in this embodiment includes the protection film 37 arranged between the channel 17d and the source electrode 17b and between the channel 17d and the drain electrode 17c. The channel 17d is formed from the semiconductor film 36 (an oxide thin film that contains indium (In), gallium (Ga), and zinc (Zn)). The protection film 37 is made of silicon oxide ($SiO_2$). According to this configuration, oxidation or reduction of the channel 17d is less likely to occur and thus the electrical characteristics are less likely to change. Furthermore, the channel 17d is less likely to be etched during the formation of the source electrode 17b and the drain electrode 17c. The protection film 37 includes holes at positions that overlap the source electrode 17b and the drain electrode 17c in a plan view. The source electrode 17b and the drain electrode 17c are connected to the channel 17d via the holes.

The pixel electrode 18 has a vertically-long rectangular overall shape in a plan view and arranged in an area defined by the gate lines 19 and the source lines 20. The pixel electrode 18 includes a comb-shaped portion with longitudinal slits 18a. As illustrated in FIG. 4, the pixel electrode 18 is formed on the second interlayer insulation film 41. The second interlayer insulation film 41 is between the pixel electrode 18 and a common electrode 22, which will be described later. The pixel electrode 18 is connected to the first drain electrode 17c of the TFT 17 via contact holes CH formed in the first interlayer insulation film 39, the organic insulation film 40, and the second interlayer insulation film 41. When the TFT 17 is driven, a predetermined potential is applied to the pixel electrode 18. The common electrode 22 is a solid trace formed in a substantially whole area of the display area AA of the array board 11b. The common electrode 22 is formed on the organic insulation film 40. A common potential (a reference potential) is applied to the common electrode 22 through a common line (a static dissipating line), which will be described later. By controlling the potential applied to the pixel electrode by the TFT 17 as described above, a predetermined potential difference occurs between the electrodes 18 and 22. When a potential difference appears between the electrodes 18 and 22, a fringe field (an oblique field) including a component in a direction normal to a plate surface of the array board 11b is applied to the liquid crystal layer 11c in addition to a component in a direction along the plate surface of the array board 11b because of the slits 18a of the pixel electrode 18. Therefore, not only alignment of the liquid crystal molecules in the slits 18a in the liquid crystal layer 11c but also alignment of the liquid crystal molecules on the pixel electrode 18 is properly switchable. With this configuration, the aperture ratio of a liquid crystal panel 11 improves and a sufficient amount of transmitted light is achieved. Furthermore, high view-angle performance is achieved. Capacitor lines may be provided (not illustrated). The capacitor lines may extend parallel to the gate lines 19, and may cross and overlap the gate lines 19 via the pixel electrodes 18, and overlap the gate insulator 35, the protection film 37, the first interlayer insulation film 39, the organic insulation film 40, and the second insulation film 41.

Next, configurations of components in the display area AA of the CF board 11a will be described in detail. As illustrated in FIG. 3, the CF board 11a includes color filters 11h including red (R), green (G), and blue (B) color portions arranged in a matrix so as to overlap the pixel electrodes 18 on the array board 11b in a plan view. A light blocking layer (a black matrix) 11i is formed in a grid to restrict colors from mixing. Each line of the grid is located between the adjacent color portions of the color filters 11h. The light blocking layer 11i is arranged over the gate lines 19 and the source lines 20 in a plan view. An alignment film 11d is formed on the surfaces of the color filters 11h and the light blocking layer 11i. Each display pixel of the liquid crystal panel 11 includes three color portions, that is, R, G and B color portions and three pixel electrodes 18 opposite the color portions, respectively. The display pixel includes a red pixel including the R color portion, a green pixel including the G color portion, and a blue pixel including the B color portion. The pixels are arranged on the plate surface of the liquid crystal panel 11 in repeated sequence along the row direction (the X-axis direction) and form groups of pixels. The groups of pixels are arranged along the column direction (the Y-axis direction).

Figure 5:
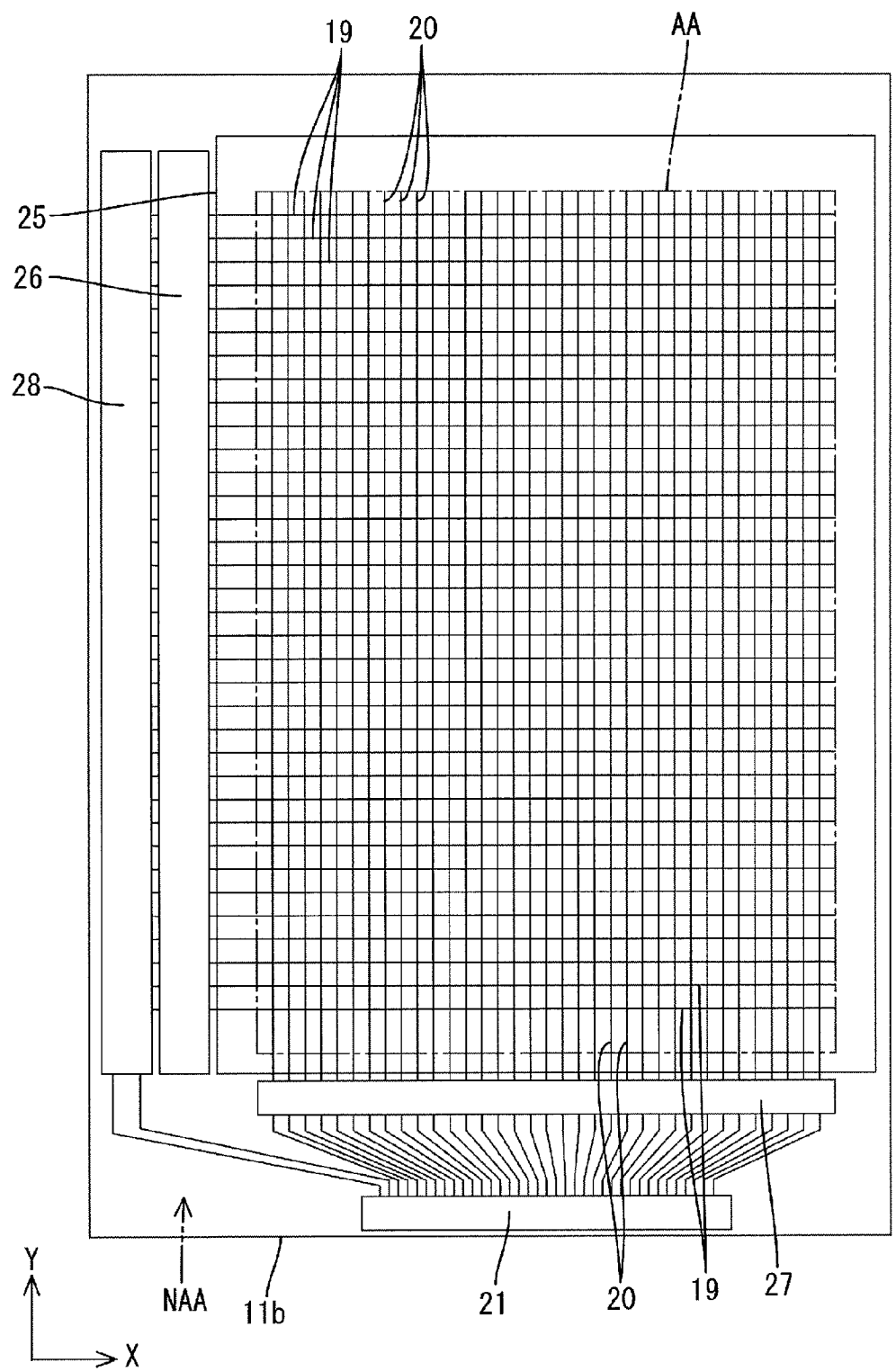
FIG. 5 is a plan view schematically illustrating a wiring layout of the array board included in the liquid crystal panel.

Next, configurations of components in the non-display area NAA of the array board 11b will be described in detail. As illustrated in FIG. 5, the common line 25 is routed around the display area AA (or formed in a frame-like shape or a ring shape). The common line 25 is connected to the common electrode 22 via a contact portion, which is not illustrated. With this configuration, a common potential is applied to the common electrode 22 by the driver 21. The column control circuit 27 is arranged in an area of the non-display area NAA of the array board 11b adjacent to the short edge of the display area AA. The static protection circuit portion 26 and the row control circuit 28 are arranged in an area of the non-display area NAA adjacent to the long edge of the display area AA. The column control circuit 27 and the row control circuit 28 are configured to control for supplying the output signals from the driver 21 to the TFTs 17. The static protection circuit portion 26 is configured to protect the TFTs 17 in the display area AA from electrostatic breakdown. Each of the static protection circuit portion 26, the column control circuit 27, and the row control circuit 28 is a monolithic circuit formed on an array board 11b with an oxide film (the semiconductor film 36) containing indium (In), gallium (Ga), and zinc (Zn) as a base, which is similar to each TFT 17. The static protection circuit portion 26, the column control circuit 27, and the row control circuit 28 include control circuits for controlling supply of the output signals to the TFTs 17 and static control circuits (diodes 29, 30, which will be described later). The common line 25, the static protection circuit portion 26, the column control circuit 27, and the row control circuit 28 are formed on the array board 11b by patterning using a known photolithography method at the same time when the TFTs 17 are formed by patterning in a fabrication process of the array board 11b.

As illustrated in FIG. 5, the column control circuit 27 is arranged adjacent to the short edge of the display area AA on the lower side in FIG. 5. Namely, the column control circuit 27 is arranged between the display area AA and the driver 21 with respect to the Y-axis direction and in a horizontally-long rectangular area that is elongated in the X-axis direction. The column control circuit 27 is connected to the source lines 20 in the display area AA. The column control circuit 27 includes switching circuit (RGB switching circuit) configured to sort image signals in the output signals from the driver 21 to the respective source lines 20. The source lines 20 are arranged in the display area AA of the array board 11b along the X-axis direction and parallel to each other. The source lines 20 are connected to the TFTs 17 that form R (red), G (green) and B (blue) pixels, respectively. The column control circuit 27 sorts the image signals from the driver 21 using the switching circuit and supplies the sorted signals to the respective R, G, B source lines 20. The column control circuit 27 may include ancillary circuits such as a level-shifter circuit.

As illustrated in FIG. 5, the row control circuit 28 is arranged adjacent to the long edge of the display area AA on the left in FIG. 5 such that the static protection circuit portion 26 is sandwiched between the row control circuit 28 and the long edge of the display area AA. The row control circuit 28 is arranged in a vertically-long area that extends in the Y-axis direction. The row control circuit 28 is connected to the gate lines 19 in the display area AA. The row control circuit 28 includes a scanning circuit configured to supply scan signals included in the output signals from the driver 21 to the gate lines 19 at the predetermined timing to scan the gate lines 19 in sequence. The gate lines 19 are arranged in the display area AA of the array board 11b along the Y-axis direction and parallel to each other. The row control circuit 28 supplies control signals (the scan signals) from the driver 21 using the scanning circuit to the gate lines 19 in sequence from the one at the top in FIG. 5 to the one at the bottom to scan the gate lines 19. The row control circuit 28 may include ancillary circuits such as a level-shifter circuit and a buffer circuit. The column control circuit 27 and the row control circuit 28 are connected to the driver 21 via lines formed on the array board 11b.

Figure 6:
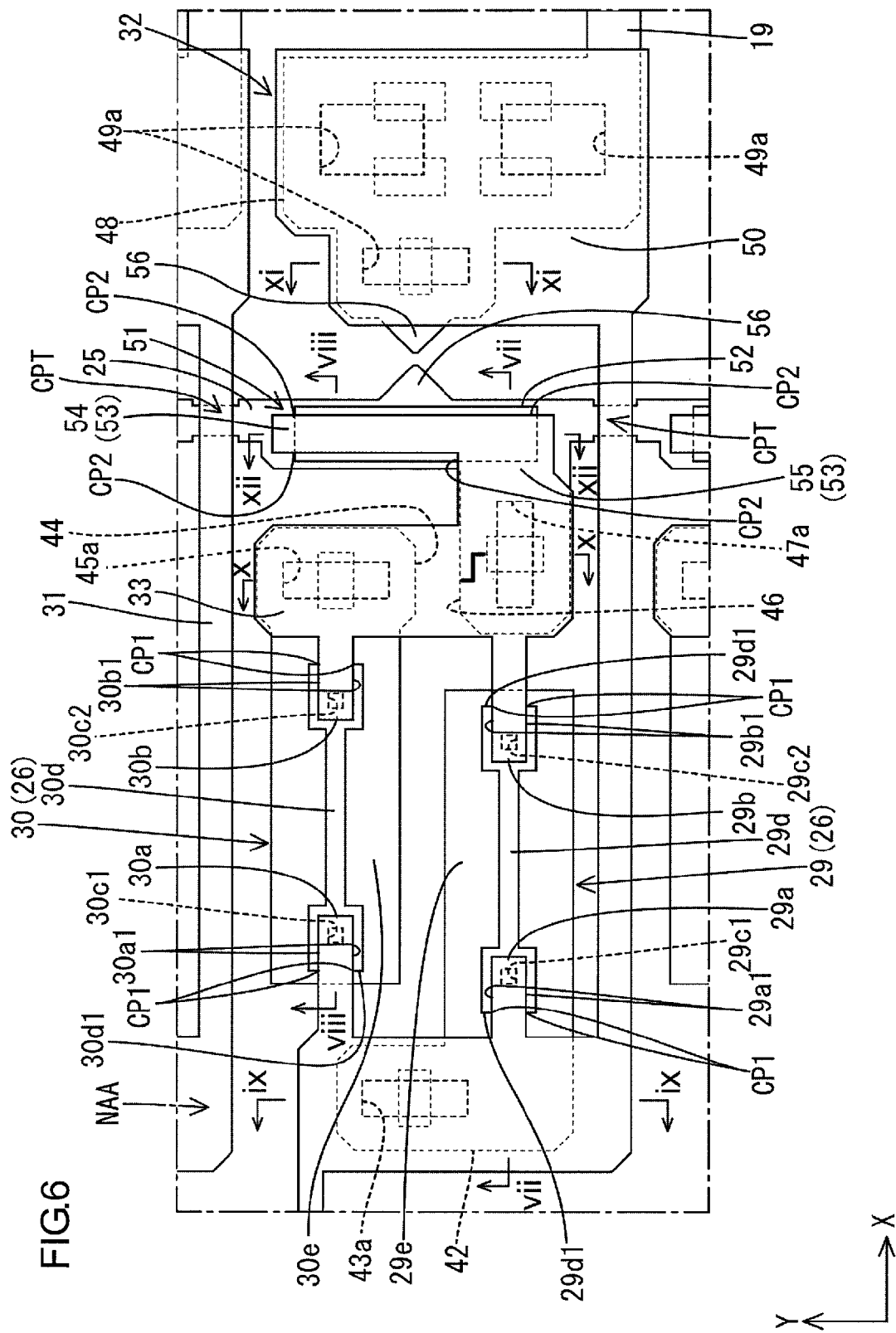
FIG. 6 is a plan view of the array board illustrating a static protection circuit portion, a common line, a static protection portion, and a contact portion.

As illustrated in FIG. 5, the static protection circuit portion 26 is arranged adjacent to the long edge of the display area AA on the left side in FIG. 5. The static protection circuit portion 26 is arranged in a vertically-long rectangular area that is elongated in the Y-axis direction similar to the row control circuit 28. The static protection circuit portion 26 is electrically connected to the gate lines 19, the common line 25, and the row control circuit 28. As illustrated in FIG. 6, the static protection circuit portion 26 includes two diodes 29, 30 for each gate line 19 as static protection circuits. The diodes 29, 30 are circularly arranged. An electrode 29a of the diode 29 and an electrode 30a of the diode 30 are connected to the corresponding gate line 19 and the row control circuit 28. The other electrode 29b of the diode 29 and the other electrode 30b of the diode 30 are connected to the common line 25. According to this configuration, an electrostatic charge (ESD) in the gate line 19 or the row control circuit 28 is dissipated to the common line 25 and thus the TFTs 17 in the display area AA are protected from the electrostatic damages. Pairs of the diodes 29, 30 that function as the static protection circuits are arranged along the Y-axis direction, which corresponds to an arrangement direction of the gate lines 19. The number of the pairs is equal to the number of the gate lines 19.

More specifically, in the static protection circuit portion 26, the electrodes 29a, 30a of a pair of diodes 29, 30 are shorted by a first shorting line 31 (a semiconductor component connecting line) as illustrated in FIG. 6. An end of the first shorting line 31 (on the left side in FIG. 6) is connected to the row control circuit 28, which is not illustrated in FIG. 6. The other end of the first shorting line 31 (on the right side in FIG. 6) is connected to the gate line 19. At a connecting point of the first shorting line 32 and the gate line 19, a contact portion 32 is present. The contact portion 32 is arranged closer to the display area AA, which is not illustrated in FIG. 6, (i.e., on a side opposite from the row control circuit 28) than the static protection circuit portion 26 and such that the common line 25 is between the static protection circuit portion 26 and the contact portion 32. In the static protection circuit portion 26, the other one of the electrodes 29b, 30 of a pair of diodes 29, 30 are shorted by a second shorting line (a second semiconductor component connecting line) 33. The second shorting line 33 is connected to the common line 25.

Next, detailed configurations of the static protection circuit portion 26, the shorting lines 31, 33, the contact portions 32, and the common line 25 will be described in sequence. As illustrated in FIG. 6, the static protection circuit portion 26 includes the same number of pairs of diodes 29, 30 as the number of the gate lines 19. Each diode 29 and the corresponding diode 30 are connected to each other to form a circular path. One of the diodes 29, 30 in one pair (the diode on the lower side in FIG. 6) is defined as a first diode (a semiconductor component) 29. The other one of the diodes 29, 30 in the pair (the diode on the upper side in FIG. 6) is defined as a second diode (a second semiconductor component) 30. An arrangement direction in which the first diode 29 and the second diode 30 are arranged is parallel to a plate surface of the glass substrate GS of the array board 11b and corresponds to the Y-axis direction (the arrangement direction of the gate lines 19, an extending direction in which the common line 25 extends).

Figure 7:
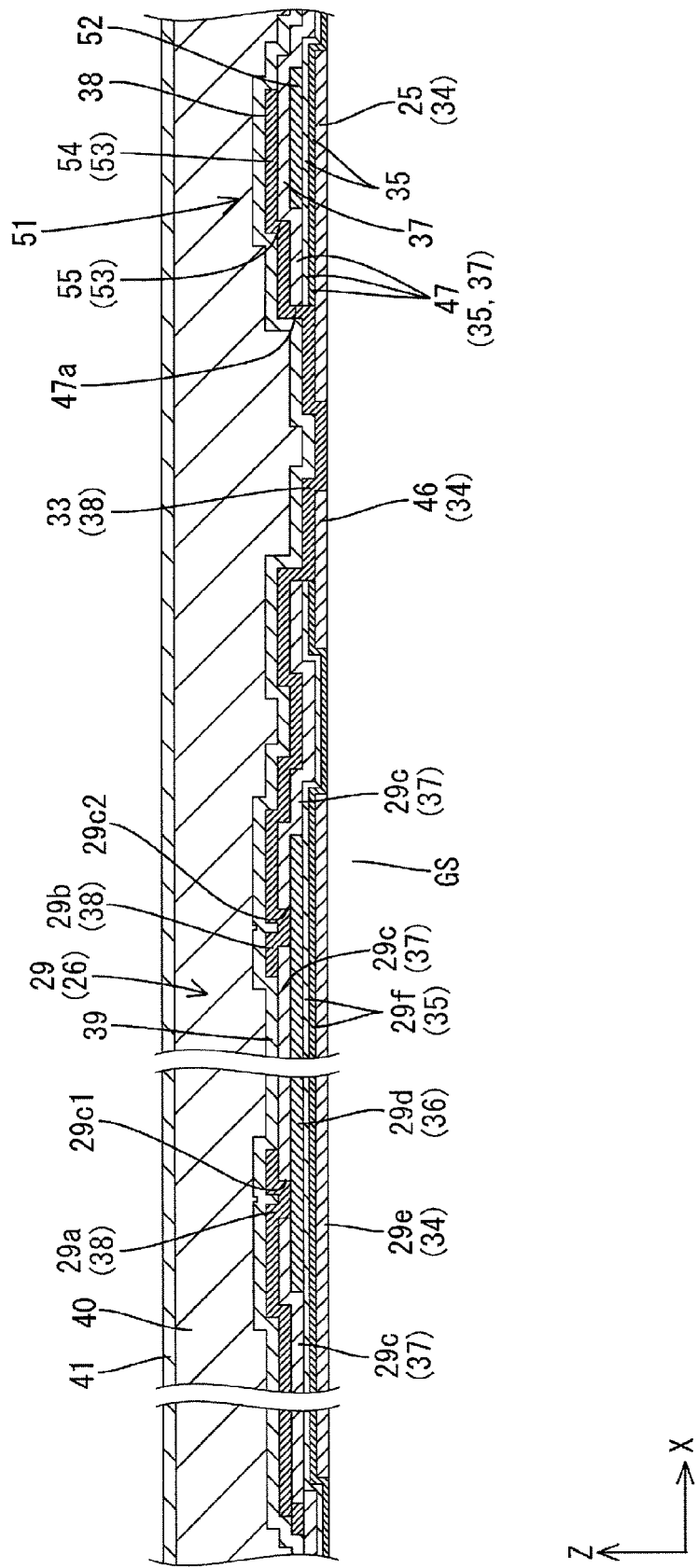
FIG. 7 is a cross-sectional view of FIG. 6 along line vii-vii.
Figure 9:
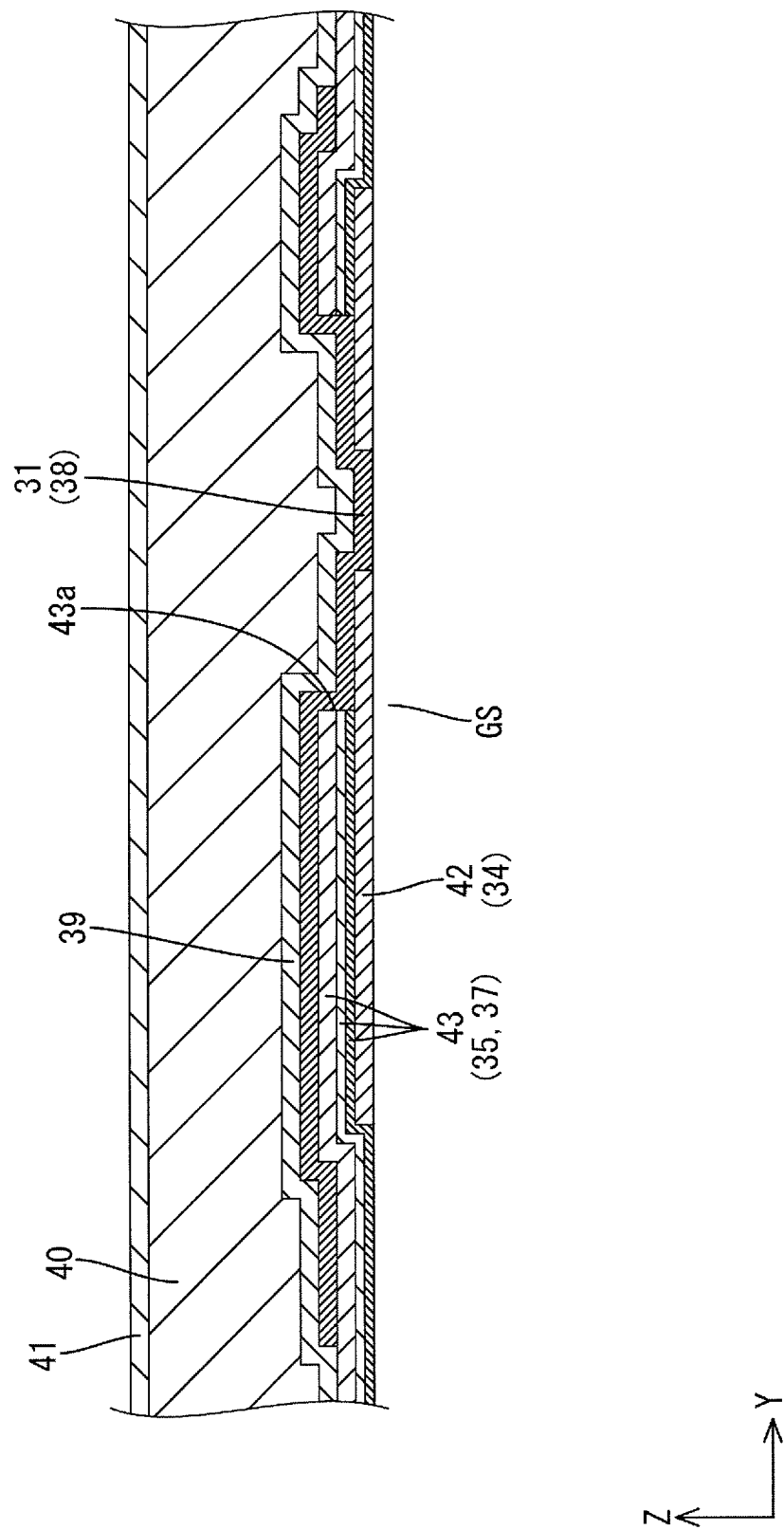
FIG. 9 is a cross-sectional view of FIG. 6 along line ix-ix.

As illustrated in FIG. 7, the first diode 29 includes two first electrodes 29a, 29b, a first protection portion (a protection portion) 29c, and a first semiconductor portion (a semiconductor portion) 29d. The first electrodes 29a, 29b are formed from the second metal film 38. The first protection portion 29c is formed from the protection film 37. The first protection portion 29c includes two first diode-side holes (semiconductor component-side holes) 29c1, 29c2 that are through holes formed at positions that overlap the first electrodes 29a, 29b, respectively, in a plan view. The first semiconductor portion 29d is formed from the semiconductor film 36 and connected to the first electrodes 29a, 29b via the first diode-side holes 29c1, 29c2, respectively. An arrangement direction of the first electrodes 29a, 29b in each pair and the longitudinal direction of the first semiconductor portion 29d are parallel to the plate surface of the glass substrate GS of the array board 11b and correspond to the X-axis direction (a direction perpendicular to the arrangement direction of the diodes 29, 30 in the corresponding pair). The first diode 29 includes a first gate electrode (a gate electrode) 29e and a first insulating layer 29f. The first gate electrode 29e is formed from the first metal film 34 and arranged so as to overlap the first electrodes 29a, 29b and the first semiconductor portion 29d in a plan view. The first insulating layer 29f is formed from the gate insulator 35. The first insulating layer 29f insulates the first gate electrode 29e from the first semiconductor portion 29d. The first gate electrode 29e continues to a first shorting line-side connecting portion (a semiconductor component connecting line-side connecting portion) 42 that is formed from the second metal film 38 and arranged so as to overlap the first shorting line 31 in a plan view. The first shorting line-side connecting portion 42 is connected to the first shorting line 31. The first shorting line-side connecting portion 42 is formed from the first metal film 34, which also forms the first gate electrode 29e. As illustrated in FIG. 9, the first shorting line-side connecting portion 42 is connected to the first shorting line 31 via a first gate electrode-side hole (a gate electrode-side hole) 43a that is a through hole formed in the first gate electrode-side insulator (a gate electrode-side insulator) 43 arranged between the first shorting line-side connecting portion 42 and the first shorting line 31. The first gate electrode-side insulator 43 is formed from the gate insulator 35 and the protection film 37. The first electrode 29a that is one of the electrodes of the first diode 29 (on the left side in FIG. 6) continues to the first shorting line 31 that is formed from the second metal film 38, which also forms the first electrode 29a. Namely, the first electrode 29a and the first gate electrode 29e of the first diode 29 are shorted by the first shorting line 31. Although the first diode 29 has a structure similar to a transistor, the first diode 29 functions as a diode.

The first shorting line 31 is formed from the second metal film 38. As illustrated in FIG. 6, the first shorting line 31 is routed from the row control circuit 28 side to the contact portion 32 side with respect to the X-axis direction while crossing the static protection circuit portion 26 and the common line 25 therebetween. One of the ends of the first shorting line 31 is connected to the row control circuit 28 and the other end is connected to the gate line 19 via the contact portion 32. A portion of the first shorting line 31 adjacent to the diodes 29, 30 in the static protection circuit portion 26 on the left side in FIG. 6 overlaps the first shorting line-side connecting portion 42 that continues from the first gate electrode 29e in a plan view. The portion is connected to the first shorting line-side connecting portion 42 via the first gate electrode-side hole 43a of the first gate electrode-side insulator 43. The portion continues from the electrodes 29a, 30a of the diodes 29, 30 in the corresponding pair.

Figure 8:
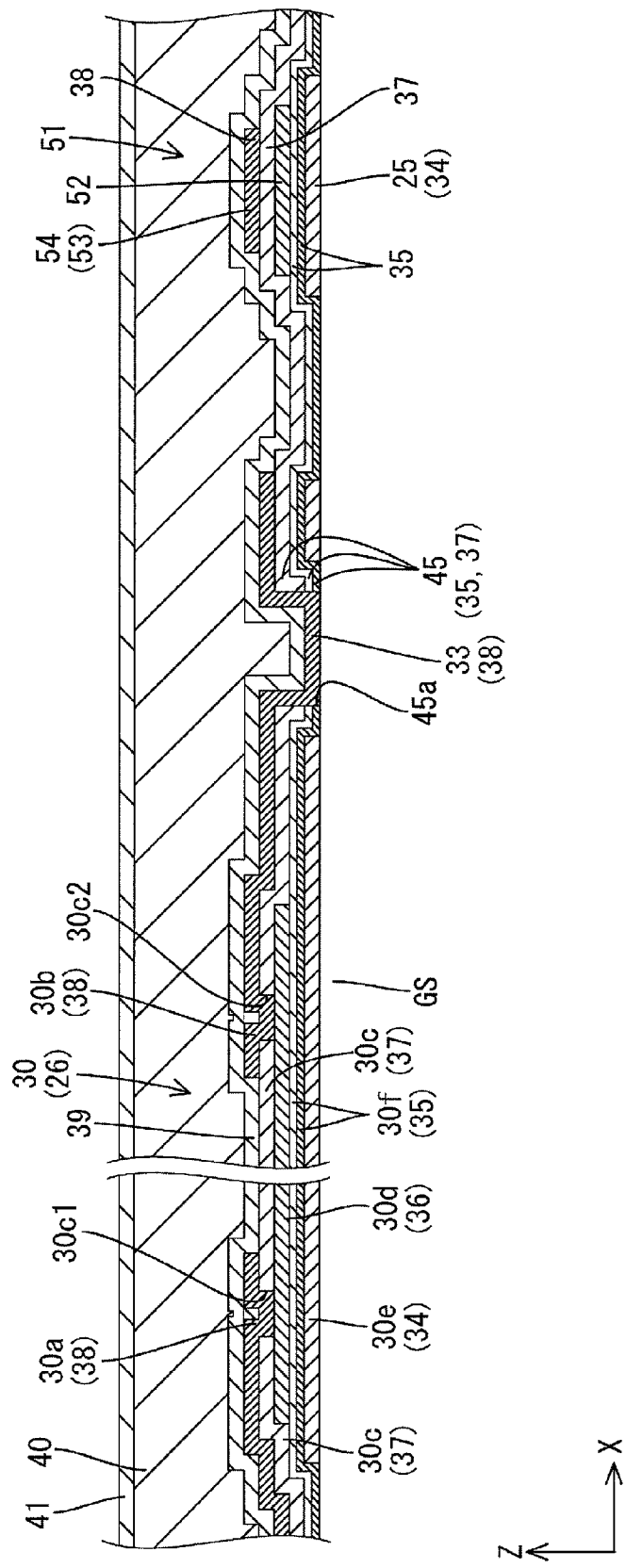
FIG. 8 is a cross-sectional view of FIG. 6 along line viii-viii.
Figure 10:
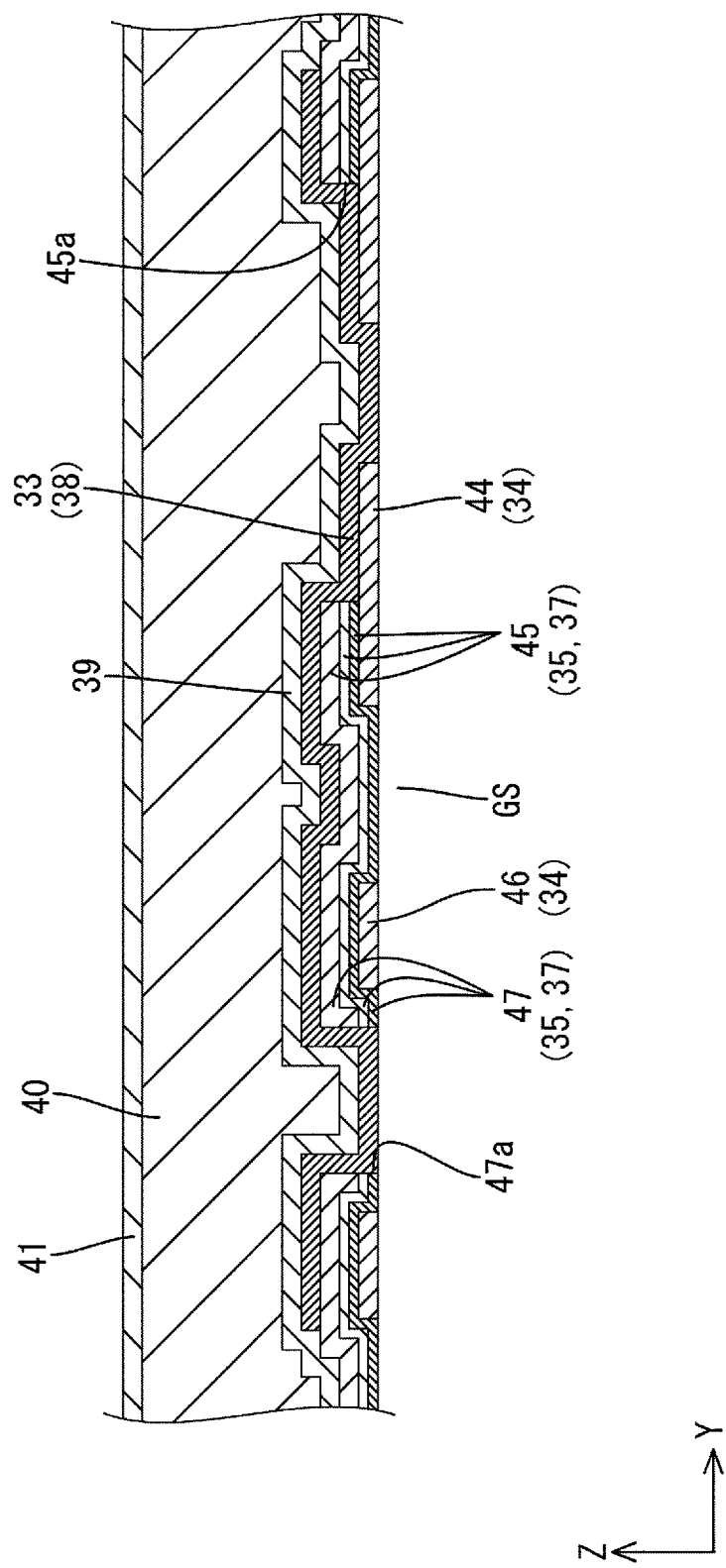
FIG. 10 is a cross-sectional view of FIG. 6 along line x-x.

As illustrated in FIG. 8, the second diode 30 includes two second electrodes (second electrodes) 30a, 30b, a second protection portion (a second protection portion) 30c, and a second semiconductor portion (a second semiconductor portion) 30d. The second electrodes 30a, 30b are formed from the second metal film 38. The second protection portion 30c is formed from the protection film 37. The second protection portion 30c includes two second diode-side holes (second semiconductor component-side holes) 30c1, 30c2 that are through holes formed at positions that overlap the second electrodes 30a, 30b, respectively, in a plan view. The second semiconductor portion 30d is formed from the semiconductor film 36. The second semiconductor portion 30d is connected to the second electrodes 30a, 30b via the second diode-side holes 30c1, 30c2, respectively. An arrangement direction of the second electrodes 30a, 30b in each pair and the longitudinal direction of the second semiconductor portion 30d correspond to the Y-axis direction, that is, to the arrangement direction of the first electrodes 29a, 29b and the longitudinal direction of the first semiconductor portion 29d. The second diode 30 includes a second gate electrode (a second gate electrode) 30e and a second insulating layer 30f. The second gate electrode 30e is formed from the first metal film 34 and arranged so as to overlap the second electrodes 30a, 30b and the second semiconductor portion 30d in a plan view. The second insulating layer 30f is formed from the gate insulator 35. The second insulating layer 30f insulates the second gate electrode 30e from the second semiconductor portion 30d. The second gate electrode 30e continues to a second shorting line-side connecting portion (a second semiconductor component connecting line-side connecting portion) 44 that is formed from the second metal film 38 and arranged so as to overlap the second shorting line 33 in a plan view. The second shorting line-side connecting portion 44 is connected to the second shorting line 33. The second shorting line-side connecting portion 44 is formed from the first metal film 34, which also forms the first gate electrode 30e. As illustrated in FIG. 10, the second shorting line-side connecting portion 44 is connected to the second shorting line 33 via a second gate electrode-side hole (a second gate electrode-side hole) 45a that is a through hole formed in the second gate electrode-side insulator (a second gate electrode-side insulator) 45 arranged between the second shorting line-side connecting portion 44 and the second shorting line 33. The second gate electrode-side insulator 44 is formed from the gate insulator 35 and the protection film 37. The second electrode 30b that is one of the electrodes of the second diode 30 (on the right side in FIG. 6) continues to the second shorting line 33 that is formed from the second metal film 38, which also forms the second electrode 30b. Namely, the second electrode 30a and the second gate electrode 30e of the second diode 30 are shorted by the second shorting line 33. Although the second diode 30 has a structure similar to a transistor, the second diode 30 functions as a diode.

The second shorting line 33 is formed from the second metal film 38. As illustrated in FIG. 6, the second shorting line 33 is arranged adjacent to the common line 25 on a side opposite from the contact portion 32 with respect to the X-axis direction. With respect to the Y-axis direction, the second shorting line 33 is arranged between the adjacent first shorting lines 31. The second shorting line 33 is arranged between the common line 25 and the diodes 29, 30 in the static protection circuit portion 26. The second shorting line 33 overlaps the second shorting line-side connecting portion 44 that continues from the second gate electrode 20e. The second shorting line 33 is connected to the second shorting line-side connecting portion 44 via the second gate electrode-side hole 45a in the second gate electrode-side insulator 45. The second shorting line 33 continues from the electrodes 29b, 30b of the diodes 29, 30 in the corresponding pair. The second shorting line-side connecting portion 44 is not directly connected to the common line 25. Specifically, a common line-side connecting portion (a static dissipating line-side connecting portion) 46 projects from a side edge of the common line 25 on the static protection circuit portion 26 side. The common line-side connecting portion 46 is arranged so as to overlap a portion of the second shorting line 33 not overlapping the second shorting line-side connecting portion 44 in a plan view. A second shorting line-side insulator (a second semiconductor component connecting line-side insulator) 47 arranged between the common line-side connecting portion 46 and the second shorting line 33 includes a second shorting line-side hole (a second semiconductor component connecting line-side hole) 47a that is a through hole. The second shorting line 33 is connected to the common line-side connecting portion 46 via the second shorting line-side hole 47a.

Figure 13:
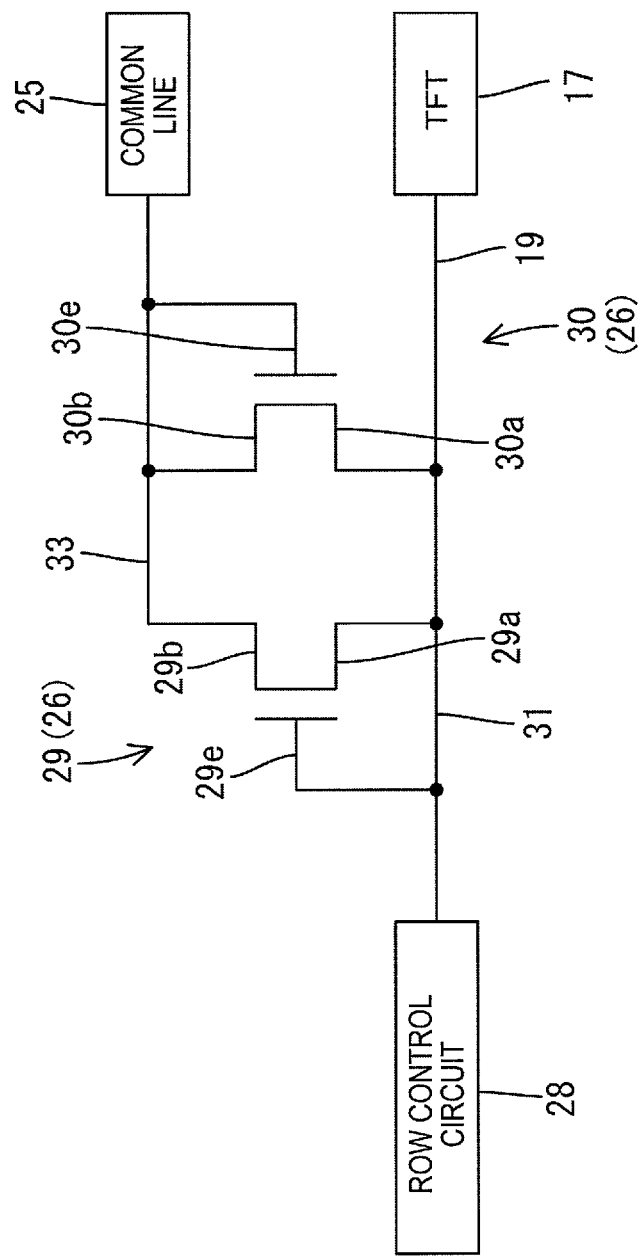
FIG. 13 is a schematic circuit diagram illustrating a configuration of the static protection circuit portion in the static protection portion.

The connections of the diodes 29, 30 in the static protection circuit portion 26 will be described with reference to the circuit diagram in FIG. 13. As illustrated in FIG. 13, the first electrode 29a of the first diode 29, the first gate electrode 29e, and the second electrode 30a of the second diode 30 are shorted by the first shorting line 31 and connected to the gate line 19. The first electrode 29b of the first diode 29, the second electrode 30b and the second gate electrode 30e of the second diode 30 are shorted by the second shorting line 33 and connected to the common line 25. Each of the diodes 29, 30 having the transistor configuration has a threshold voltage that is set higher than a voltage related to a signal transmitted from the row control circuit 28 to the gate line 19 via the first shorting line 31 but lower than a voltage applied when an electrostatic discharge occurs. According to this configuration, the diodes 29, 30 does not turn on when the liquid crystal panel 11 is driven and signals from the row control circuit 28 are properly transmitted to the gate line 19. If static is applied to the gate line 19 and a potential at the gate light 19 becomes higher than a potential at the common line 25, the diodes 29, 30 turn on and the static is dissipated to the common line 25. If the static is applied to the common line 25 and the potential at the gate line 19 becomes lower than the potential at the common line 25, the diodes 29, 30 also turn on and the static is dissipated.

Figure 11:
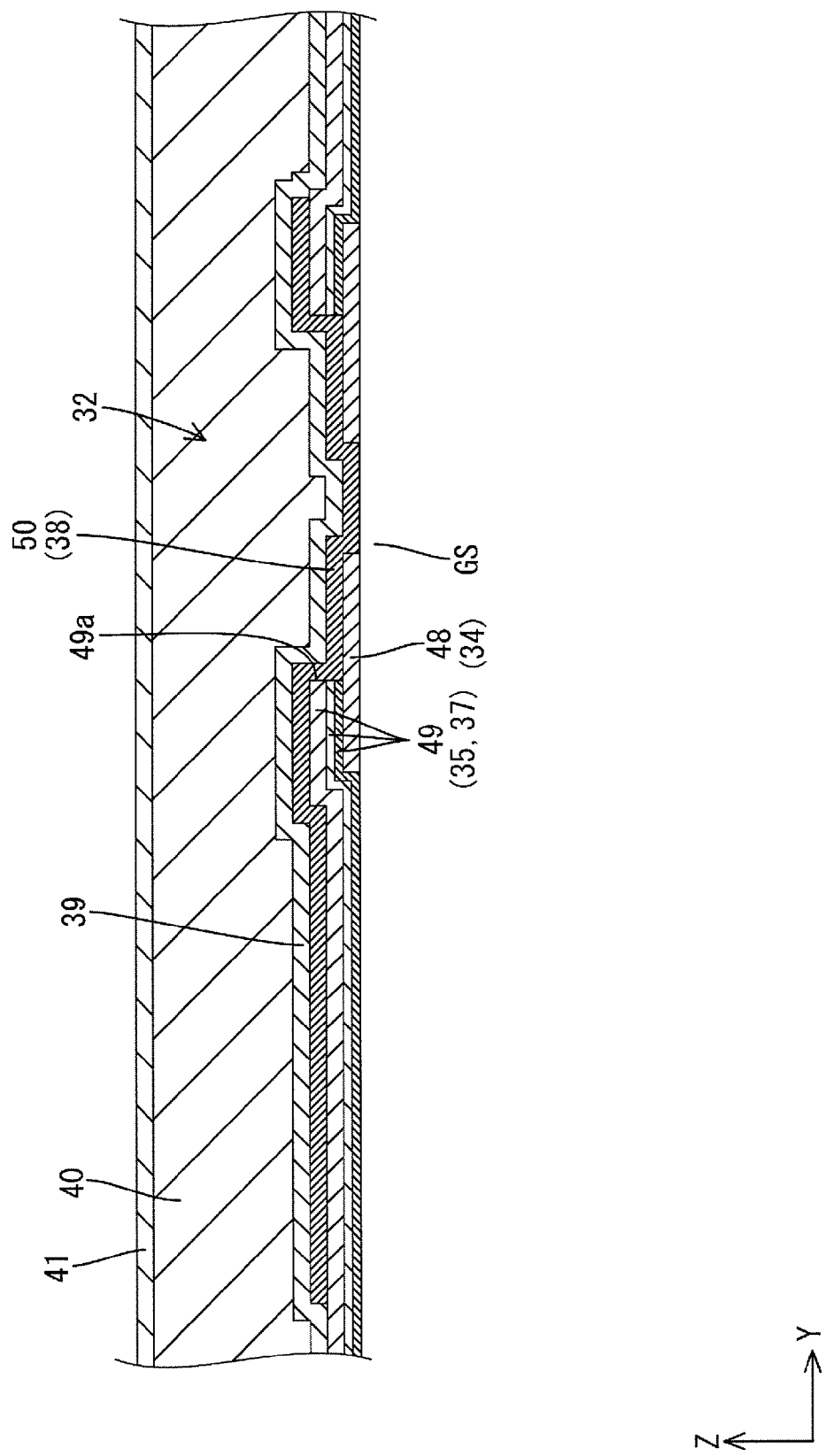
FIG. 11 is a cross-sectional view of FIG. 6 along line xi-xi.

Next, the contact portion 32 will be described. As illustrated in FIG. 6, the contact portion 32 is arranged in an area between the common line 25 and the display area AA with respect to the X-axis direction. As illustrated in FIG. 11, the contact portion 32 includes a gate line-side connecting portion (a signal line-side connecting portion) 48, a contact portion-side insulator 49, and a diode-side connecting portion (a semiconductor component-side connecting portion) 50. The gate line-side connecting portion 48 is formed from the first metal film 34 at an end of the gate line 19. The contact portion-side insulator 49 is formed from the gate insulator 35 and the protection film 37. The contact portion-side insulator 49 includes contact portion-side holes 49a that are through holes formed at positions that overlap the gate line-side connecting portion 48 in a plan view. The diode-side connecting portion 50 is formed from the second metal film 38 at the other end of the first shorting line 31. The diode-side connecting portion 50 is connected to the gate line-side connecting portion 48 via the contact portion-side holes 49a. The diode-side connecting portion 50 is shorted to the electrodes 29a, 30a of the diodes 29, 30 in the static protection circuit portion 26 and the first gate electrode 29e. The gate line-side connecting portion 48 and the diode-side connecting portion 50 project toward the upper side in FIG. 6 relative to the gate line 19 and the first shorting line 31. The gate line-side connecting portion 48 and the diode-side connecting portion 50 are arranged along the X-axis direction relative to the static protection circuit portion 26 such that the common line 25 is therebetween. Three contact portion-side holes 49a are formed at positions that overlap the gate line-side connecting portion 48 and the diode-side connecting portion 50. Namely, the gate line-side connecting portion 48 and the diode-side connecting portion 50 are connected at three points.

Next, the common line 25 will be described. The common line 25 is formed from the first metal film 34. As illustrated in FIG. 6, the common line 25 is arranged at a position so as to separate the static protection circuit portion 26 and the contact portion 32 from each other. The common line 25 extends in the Y-axis direction and crosses a number of the first shorting lines 31. The common line 25 continues to the common line-side connecting portion 46 that overlaps a portion of the second shorting line 33, which is described earlier, in a plan view. Namely, the common line 25 continues to a portion that projects from an edge of the common line 25 opposite the static protection circuit 26 toward the static protection circuit 26 (opposite from the contact portion 32). The portion is configured as the common line-side connecting portion 46. The common line 25 crosses the first shorting lines 31 arranged such that the projecting portion is sandwiched by the first shorting lines 31 from the upper and the lower side in FIG. 6, that is, with respect to the Y-axis direction. Portions at which the common line 25 crosses the first shorting lines 31 are referred to as intersections CPT.

In the fabrication process of the array board 11b, static may be directly applied to the diodes 29, 30 in the static protection circuit 26 and electrostatic breakdown may occur.

Figure 14:
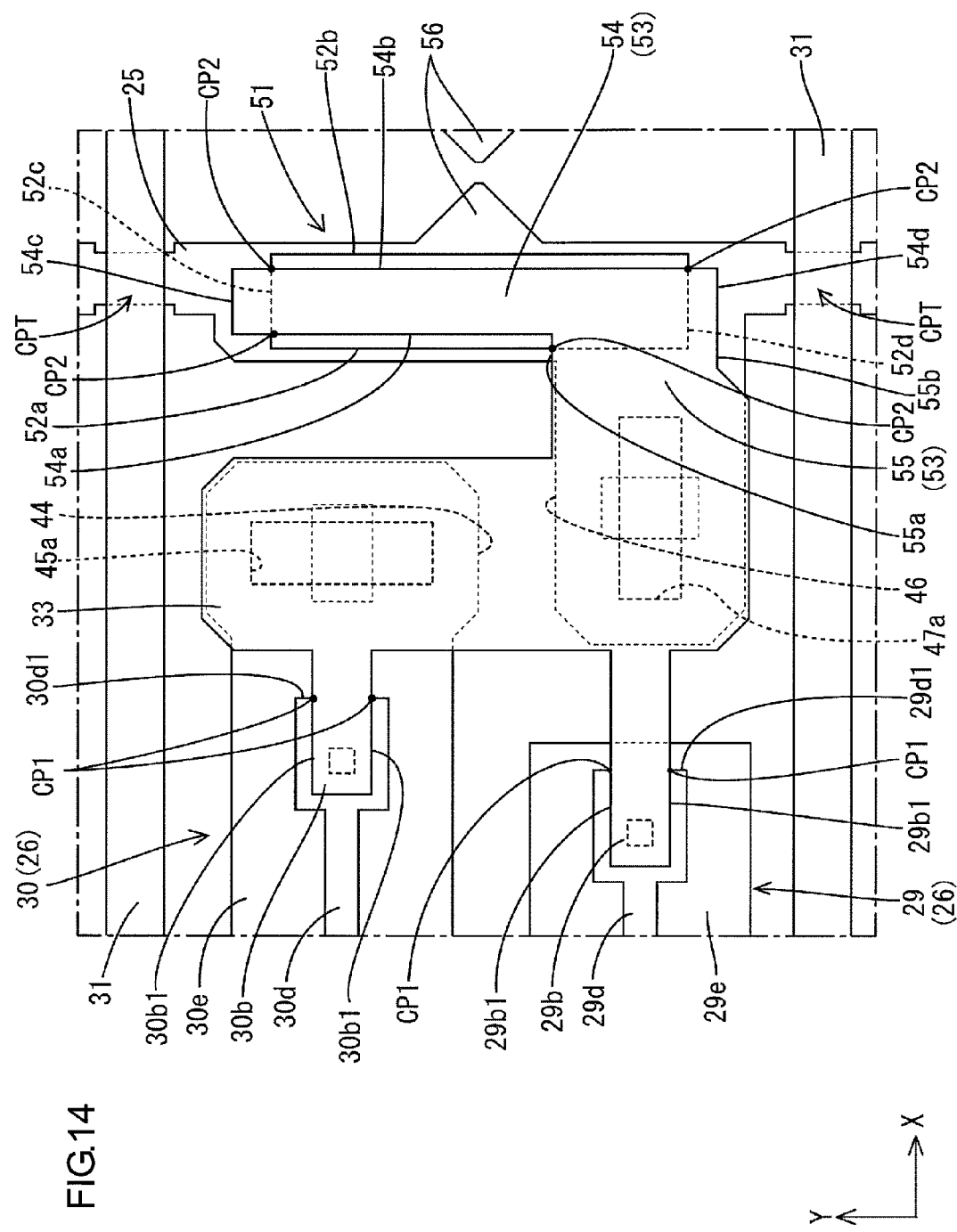
FIG. 14 is a magnified plan view illustrating the static protection portion.

As illustrated in FIGS. 6 and 14, the first electrodes 29a, 29b include a pair of outer edges 29a1 and a pair of outer edges 29b1, respectively. The outer edges 29a1, 29b1 extend along the X-axis direction. The first semiconductor portion 29d includes a pair of outer edges 29d1. The outer edges 29d1 extend along the Y-axis direction. The outer edges 29a1 and the corresponding outer edge 29d1 intersect (or cross) each other at two points. The outer edges 29b1 and the corresponding outer edge 29d1 intersect (or cross) each other at two points. An interior angle defined by each of the outer edges 29a1, 29b1 and the corresponding outer edge 19d1 is about 270 degrees. If the semiconductor film 36 and the second metal film 38 cross each other and an interior angle at the intersection of those is 180 degrees or larger, coverage of the gate insulator 35 in a lower layer at the intersection CP1 may decrease. At the intersection CP1, insulating performance may decrease. Static that may be built up in the fabrication process of the array board 11b is more likely to directly applied to the intersection CP1 at which the insulating performance has decreased. If the static is applied to the intersection CP1, the first gate electrode 29e formed from the first metal film 34 may be shorted to the first electrodes 29a, 29b and the first semiconductor portion 29d. Such an electrostatic breakdown may occur at the intersection CP1 between the outer edges 30a1, 30b1 of the second electrodes 30a, 30b of the second diode 30 and outer edges 30d1 of the second semiconductor portion 30d. The static protection circuit portion 26 includes a total of eight intersections CP1 because each of the electrodes 29a, 29b, 30a, 30b of the diodes 29, 30 includes two intersections CP1.

Figure 12:
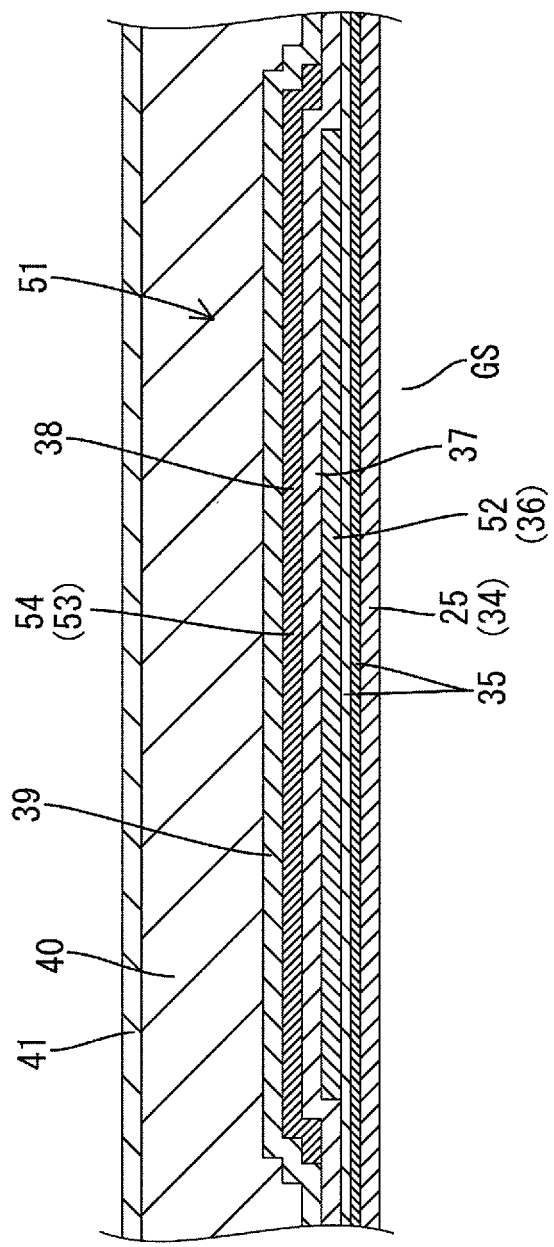
FIG. 12 is a cross-sectional view of FIG. 6 along line xii-xii.

As illustrated in FIG. 6, a static protection portion 51 is formed at the position that overlap at least a portion of the common line 25 in a plan view (in a normal direction to the plate surface of the glass substrate GS) and closer to the static protection circuit portion 26 than the intersection CPT of the first shorting line 31 and the common line 25. The static protection portion 51 is for protecting the static protection circuit portion 26 from static that is built up in the fabrication process of the array board 11b. A portion of the common line 25 overlapping the static protection portion 51 in a plan view has a width larger than a width of other portions that do not overlap the static protection portion 51. As illustrated in FIGS. 7, 8 and 12, the static protection portion 51 includes a static dissipating portion 52 and a second static dissipating portion 53. The static dissipating portion 52 is formed from the semiconductor film 36. The second static dissipating portion 53 is formed from the second metal film 38. The static dissipating portions 52, 53 dissipate the static that is built up in the fabrication process of the array board 11b. With this configuration, the static is less likely to be directly applied to the diodes 29, 30 in the static protection circuit portion 26. The static dissipating portion 52 and the second static dissipating portion 53 will be described in detail below.

As illustrated in FIG. 14, the static dissipating portion 52 formed from the semiconductor film 36 extends for a predetermined length in a direction in which the common line 25 extends, that is, the Y-axis direction. The static dissipating portion 52 has a vertically-long rectangular shape in a plan view. The static dissipating portion 52 includes a total of four outer edges 52a-52d (a pair of long outer edges 52a, 52b and a pair of short outer edges 52c, 52d). The static dissipating portion 52 is arranged so as to overlap the wide portion of the common line 52 for the entire area thereof in a plan view. All outer edges 52a-52d are arranged on the wide portion of the common line 25. A Y-axis dimension (a length) of an area in which the static dissipating portion 52 is formed is about equal to or slightly larger than a Y-axis dimension of the area in which the first electrodes 29a, 29b (the first diode-side holes 29c1, 29c2) and the second electrodes 30a, 30b (the second diode-side holes 30c1, 30c2) of the diodes 29, 30 in the static protection circuit portion 26. An X-axis dimension (a width) of the area in which the static dissipating portion 52 is formed is slightly smaller than the width of the wide portion of the common line 25. The long outer edges 52a, 52b are arranged inside the edges of the wide portion. The static dissipating portion 52 having such a configuration is arranged so as to overlap the common line 25 in a plan view. According to this configuration, the coverage of the gate insulator 35 between the static dissipating portion 52 and the common line 25 decreases only at the overlapping portion with the static dissipating portion 52 and the insulating performance decreases only at the overlapping portion with the static dissipating portion 52. Therefore, the static dissipating portion 52 can dissipate the static. The decrease of the coverage of the gate insulator 35 means unevenness of the thickness of the gate insulator 35 at a stepped portion due to a reduction in film thickness or a decrease in adhesion to a base (the common line 25), that is, the gate insulator 35 may be easily removed from the base.

As illustrated in FIG. 14, the second static dissipating portion 53 formed from the second metal film 38 is arranged so as to overlap both the common line 25 and the static dissipating portion 52 in a plan view. The second static dissipating portion 53 extends for a predetermined length in the direction in which the common line 25 and the static dissipating portion 52 extend, that is, the Y-axis direction. The second static dissipating portion 53 includes a rectangular portion 54 and a projecting portion 55. The rectangular portion 54 has a vertically-long rectangular shape in a plan view. The projecting portion 55 projects from the rectangular portion 54 toward the static protection circuit portion 26 and continues to the second shorting line 33. The second static dissipating portion 53 has a hook-like overall shape. The second static dissipating portion 53 includes four outer edges 54a-54d that define the rectangular portion 54 (a pair of long outer edges 54a, 54b and a pair of short outer edges 54c, 54d) and two outer edges 55a, 55b that define the projecting portion 55. The outer edge 54d of the rectangular portion 54 on the lower side in FIG. 14 and the outer edge 55b of the projecting portion 55 on the lower side in FIG. 14 are in a line. Namely, the projecting portion 55 is arranged closer to the edge of the rectangular portion 54 on the lower side in FIG. 14. The long outer edges 54a, 54b of the rectangular portion 54 are parallel to the long outer edges 52a, 52b of the static dissipating portion 52. The short outer edges 54c, 54d of the rectangular portion 54 and the outer edges 55a, 55b of the projecting portion 55 are parallel to the short outer edges 52c, 52d of the static dissipating portion 52.

An X-axis dimension (a width) of an area in which the rectangular portion of the second static dissipating portion 53 is formed is smaller than that of the static dissipating portion 52. A Y-axis dimension (a length) of the area in which the rectangular portion is formed is larger than that of the static dissipating portion 52. A distance between the long outer edges 54a, 54b of the rectangular portion 54 is smaller than a distance between the long outer edges 52a, 52b of the static dissipating portion 52. A distance between the short outer edges 54c, 54d of the rectangular portion 54 is larger than a distance between the short outer edges 52c, 52d of the static dissipating portion 52. Corners of the rectangular portion 54 are not aligned with corners of the static dissipating portion 52 in a plan view. The second static dissipating portion 53 is arranged such that the outer edges 54d, 55b of the rectangular portion 54 and the projecting portion 55 on the lower side in FIG. 14 are aligned. According to this configuration, the long outer edges 54a, 54b of the rectangular portion 54 of the second static dissipating portion 53 cross the short outer edge 52c of the static dissipating portion 52 on the upper side in FIG. 14. The long outer edge 54b of the rectangular portion 54 on the right side in FIG. 14 crosses the long outer edge 52b of the static dissipating portion 52. The outer edge 55a of the projecting portion 55 on the upper side in FIG. 14 crosses the long outer edge 52a of the static dissipating portion 52 on the left side in FIG. 14. The static dissipating portion 52 and the second static dissipating portion 53 have a total of four intersections CP2. There are a total of four intersections CP2 between the static dissipating portion 52 and the second static dissipating portion 53. An angle defined by each of the outer edges 52a, 52c, 52d and the corresponding outer edge 54a, 54b, 55a at the corresponding intersection CP2 is about 270 degrees (equal to or larger than 180 degrees). At each intersection CP2, coverage of the gate insulator 35 and the protection film 37 in lower layers decrease and insulating performance decrease. Therefore, the static that is built up in the fabrication process of the array board 11b is more likely to be dissipated to the four intersections CP2. The four intersections CP2 are arranged asymmetrically to one another in the Y-axis direction.

As illustrated in FIG. 6, at a portion of the common line 25 opposed to the contact portion 32 and a portion of the gate line-side connecting portion 48 of the contact portion 32, static dissipating projections 56 are formed so as to project toward each other and configured as a pair. With the static dissipating projections 56, the static protection circuit portion 26 is protected from static that is built up in the contact portion 32 prior to the formation of the second metal film 38 in the fabrication process of the array board 11b. Furthermore, the contact portion 32 is protected from static that is built up in the static protection circuit portion 26 prior to the formation of the second metal film 38 in the fabrication process of the array board 11b. Each of the static dissipating projections 56 is formed from the first metal film 34 and in a triangular shape in a plan view such that it tapers from a base to a distal end thereof. The distal ends of the static dissipating projections 56 are arranged at about the same Y-axis position and opposite to each other with a small gap therebetween in the X-axis direction. Namely, the static dissipating projections 56 are arranged along the X-axis direction. The static dissipating projection 56 that continues from the common line 25 is arranged adjacent to the static dissipating portion 52. The Y-axis position of the static dissipating projections 56 corresponds to about the middle of the static dissipating portion 52 in the extending direction of the static dissipating portion 52.

With the static dissipating portion 52 and the static dissipating projections 56 having the configurations described above, the following functions and effects are achieved. In the fabrication process of the array board 11b, the films described above are formed on the glass substrate GS in sequence from the bottom by a known photolithography method. For the formation of the films performed in sequence, the glass substrate GS needs to be transferred to different machines. During the transfer, static may be built up on the glass substrate GS or the outermost surface of the formed films due to peeling electrostatic charge. After completion of the formation of the second metal film 38, in the static protection circuit portion 26, the outer edges 29a1, 29b1, 30a1, 30b1 of the electrodes 29a, 29b, 30a, 30b that are formed from the second metal film 38 cross the outer edges 29d, 30d of the semiconductor portion 29d, 30d that are formed from the semiconductor film 36 as illustrated in FIG. 6. The static protection circuit portion 26 includes a total of eight intersections CP1. The static may be directly applied to any one of the intersections CP1.

In this embodiment, as illustrated in FIGS. 6 and 14, the static protection portion 51 including the static dissipating portions 52, 53 is formed at the position that overlaps at least a portion of the common line 25 in a plan view and closer to the static protection circuit portion 26 than the intersection CPT of the first shorting line 31 and the common line 25. Therefore, even if static is built up in the fabrication process of the array board 11b, the static is dissipated to the static dissipating portions 52, 53. According to this configuration, the static is less likely to be directly applied to the diodes 29, 30 in the static protection circuit portion 26. Specifically, the static dissipating portion 52 is formed from the semiconductor film 36 and arranged so as to overlap the common line 25 that is formed from the first metal film 34. According to this configuration, the coverage of the gate insulator 35 between the static dissipating portion 52 and the common line 25 decreases in some areas and the insulating performance decreases. Therefore, the static that is built up in the fabrication process of the array board 11b is properly dissipated to the static dissipating portion 52 and the overlapping portion of the common line 25 with the static dissipating portion 52. Furthermore, the static protection portion 51 includes a total of four intersections CP2 at which the outer edges 52a, 52c, 52d of the static dissipating portion 52 and the outer edges 54a, 54b, 55a of the second static dissipating portion 53 that is formed from the second metal film 38 cross. At the intersections CP2, the coverage of the gate insulator 35 and the protection film 37 in the lower layers decreases and the insulating performances decrease. According to this configuration, the static that is built up in the fabrication process of the array board 11b is properly dissipated to any of the intersections CP2. Therefore, the static that is built up in the fabrication process of the array board 11b is less likely to be directly applied to the intersections CP1 of the diodes 29, 30 in the static protection circuit portion 26. A malfunction of the static protection circuit portion 26 due to electrostatic breakdown is less likely to occur. Furthermore, the static dissipating portion 52, 53 in the static protection portion 51 are arranged closer to the static protection circuit portion 26 than the intersection CPT of the first shorting line 31 and the common line 25. According to this configuration, the static that may be applied to the diodes 29, 30 is properly dissipated and thus the static is further less likely to be directly applied to the diodes 29, 30. Furthermore, the static is less likely to be directly applied to the intersection CPT of the shorting line 31 and the common line 25.

As described earlier, the array board (a semiconductor device) 11b in this embodiment includes the substrate (a glass substrate) GS, the first metal film 34, the gate insulator (an insulating film) 35, the semiconductor film 36, the protection film 37, the second metal film 38, the first diodes (a semiconductor component) 29, the common line (a static dissipating line) 25, the first shorting lines (a semiconductor component connecting line) 31, and the static protection portions 51. The first metal film 34 is formed on the glass substrate GS. The gate insulator 35 is formed at least on the first metal film 34. The semiconductor film 36 is formed on the gate insulator 35. The protection film 37 is formed at least on the semiconductor film 36 and configured to protect the semiconductor film 36. The second metal film 38 is formed on the protection film 37. Each of the first diodes 29 at least includes two first electrodes (electrodes) 29a, 29b, the first protection portion (a protection portion) 29c, and the first semiconductor portion (a semiconductor portion) 29d. The first electrodes 29a, 29b are formed from the second metal film 38. The first protection portion 29c is formed from the protection film 37. The first protection portion 29c includes two first diode-side holes (semiconductor component-side holes) 29c1, 29c2 that are through holes formed at the positions that overlap the first electrodes 29a, 29b. The first semiconductor portion 29d is formed from the semiconductor film 36. The first semiconductor portion 29d are connected to the first electrodes 29a, 29b via the first diode-side holes 29c1, 29c2, respectively. The first semiconductor portion 29d includes the outer edges 29d1 that cross the outer edges 29a1, 29b1 of the first electrodes 29a, 29b in a plan view. The common line 25 is formed from the first metal film 34. The common line 25 is arranged adjacent to the first diodes 29 in a plan view. The common line 25 extends along the plate surface of the glass substrate GS and the direction that crosses the arrangement direction of the first electrodes 29a, 29b. The common line 25 is configured to dissipate static. The first shorting lines 31 are formed from the second metal film 38. Each of the first shorting lines 31 continues from one of the first electrodes 29a, 29b in the corresponding pair. The first shorting line 31 extends along the plate surface of the glass substrate GS and along the arrangement direction of the first electrodes 29a, 29b so as to cross the common line 25. The static protection portion 51 includes at least the static dissipating portion 52. The static dissipating portion 52 is formed from the second metal film 38 or the semiconductor film 36. The static dissipating portion 52 is arranged such that at least a portion thereof overlaps the common line 25. The static dissipating portion 52 is arranged closer to the first diode 29 than the intersection CPT of the common line 25 and the first shorting line 31. The static dissipating portion 52 is configured to dissipate static.

The first semiconductor portion 29d of each first diode 29 connected to the first electrodes 29a, 29b includes the outer edges 29d1 that cross the outer edges 29a1, 29b1 of the first electrodes 29a, 29b in a plan view. Therefore, the coverage of the gate insulator 35 arranged in the lower layer decreases at the intersection CP1 of the outer edges 29d1 of the first semiconductor portion 29d and the outer edges 29a1, 29b1 of the first electrodes 29a, 29b and the insulating performance decreases. The static that is built up in the fabrication process of the array board 11b may be applied to the intersection CP1. In this embodiment, the common line 25 formed from the first metal film 34 is arranged at the position adjacent to the first diode 29 in a plan view and extends along the plate surface of the glass substrate GS and the direction that crosses the arrangement direction of the first electrodes 29a, 29b. Furthermore, the static dissipating portion 52 is formed from the second metal film 38 or the semiconductor film 36 and arranged such that at least a portion thereof overlaps the common line 25 in a plan view. Therefore, the coverage of the gate insulator 35 arranged between the static dissipating portion 52 and the common line 25 decreases in some areas and the insulating performance decreases. According to this configuration, even if static is built up in the fabrication process of the array board 11b, the static is dissipated to the static dissipating portion 52. Therefore, the static is less likely to be directly applied to the first diode 29. The static dissipating portion 52 in the static protection portion 51 is arranged closer to the first diode 29 than the intersection CPT of the first shorting line 31 and the common line 25. The first shorting line 31 is formed from the second metal film 38 and continues from one of the first electrodes 29a, 29b. The first shorting line 31 extends along the plate surface of the glass substrate GS and the arrangement direction of the first electrodes 29a, 29b. According to this configuration, the static that may be applied to the first diode 29 is more properly dissipated. The static is further less likely to be directly applied to the first diode 29. According to this embodiment, a malfunction due to the static is less likely to occur.

The semiconductor film 36 is made of oxide semiconductor. The semiconductor film 36 made of oxide semiconductor may be etched during the formation of the second metal film 38 in the fabrication process. Furthermore, oxidation or reduction of the semiconductor film 36 may occur after the formation of the film. However, the protection film 37 is arranged between the semiconductor film 36 and the second metal film 38, that is, the semiconductor film 36 is protected by the protection film 38. Therefore, the semiconductor film 36 is less likely to be etched during the formation of the second metal film 38 and the oxidation or the reduction of the semiconductor film 36 is less likely to occur after the formation of the film.

The static dissipating portion 52 is formed from the semiconductor film 36. According to this configuration, the coverage of the gate insulator 35 arranged under the static dissipating portion 52 decreases and thus the static dissipating performance increases. In comparison to a configuration in which the static dissipating portion is formed from the second metal film 38, the static dissipating portion 52 formed from the semiconductor film 36 is less likely to cause short circuit of the common line 25 even if the common line 25 in the lower layer does not have a sufficient width. Therefore, the yield improves.

The static protection portion 51 includes the second static dissipating portion 53. The static dissipating portion 53 is formed from the second metal film 38. At least a portion of the static dissipating portion 53 overlaps the static dissipating portion 52 in a plan view. The static dissipating portion 53 includes the outer edges 54a, 54b, 55a that cross the outer edges 52a, 52c, 52d of the static dissipating portion 52. The second static dissipating portion 53 includes the outer edges 54a, 54b, 55a that cross the outer edges 52a, 52c, 52d of the static dissipating portion 52 in a plan view. Therefore, the coverage of the protection film 37 and the gate insulator 35 in the lower layers decreases at the intersections CP2 of the outer edges 54a, 54b, 55a of the second static dissipating portion 53 and the outer edges 52a, 52c, 52d of the static dissipating portion 52. The static is dissipated to the intersections CP2. According to this configuration, the static is further less likely to be directly applied to the first diode 29.

The static dissipating portion 52 has a rectangular shape in a plan view and the second static dissipating portion 53 is arranged such that the outer edges 54a, 54b, 55b thereof cross the outer edges 52a, 52c, 52d of the static dissipating portion 52 at least at four points. Because the outer edges 52a, 52c, 52d of the static dissipating portion 52 that is rectangular in a plan view cross the outer edges 54a, 54b, 55a of the second static dissipating portion 53 at least at four points, the static that may be applied to the first diode 29 is further less likely to be dissipated. Therefore, the static is further less likely to be directly applied to the first diode 29.

The second static dissipating portion 53 includes four outer edges 54a-54d that are parallel to the respective outer edges 52a-52d of the static dissipating portion 52. The second static dissipating portion 53 is formed such that the distance between the outer edges 52a, 52b that are parallel to each other (or the outer edges 52c, 52d) is different from the distance between the outer edges 54a 54b (or the outer edges 54c, 54d) of the static dissipating portion 52 parallel to each other. Because the second static dissipating portion 53 has a simple plan-view shape, advantageous effects including a preferable yield rate in production can be achieved.

Furthermore, the second shorting line (a second semiconductor component connecting line) 33, the second shorting line-side insulator (a second semiconductor component connecting line-side insulator) 47, and the common line-side connecting portion (a static dissipating line-side connecting portion) 46 are provided. The second shorting line 33 is formed from the second metal film 38 and continues from the other one of the first electrodes 29a, 29b of the first diode 29. The second shorting line-side insulator 47 is formed from the gate insulator 35 and the protection film 37. The second shorting line-side insulator includes the second shorting line-side hole (a second semiconductor component connecting line-side hole) 47a that is a through hole formed at the position overlapping the second shorting line 33 in a plan view. The common line-side connecting portion 46 is formed from the first metal film 34 and continues from the common line 25. The common line-side connecting portion 46 is arranged such that at least a portion thereof overlaps the second shorting line 33 in a plan view and connected to the second shorting line 33 via the second shorting line-side hole 47a. One of the first electrodes 29a, 29b of the first diodes 29 is connected to the first shorting line 31 and the other is connected to the second shorting line 33. The second shorting line 33 is connected to the common line-side connecting portion 46 that continues from the common line 25 via the second shorting line-side hole 47a. According to this configuration, even if the potential at the first shorting line 31 becomes higher than the potential at the common line 25 due to the static, a current is routed to the common line 25 through the first semiconductor portion 29d of the first diode 29. This compensates the potential difference.

Furthermore, the second diode (a second semiconductor component) 30 is provided. The second diode 30 at least includes two second electrodes (second electrodes 9 30a, 30b, the second protection portion (a second protection portion) 30c, and the second semiconductor portion (a second semiconductor portion) 30d. The second electrodes 30a, 30b are formed from the second metal film 38. The second protection portion 30c is formed from the protection film 37. The second protection portion 30c includes two second diode-side holes (second semiconductor component-side holes) 30ca, 30c2 that are through holes formed at the positions that overlap the second electrodes 30a, 30b, respectively. The second semiconductor portion 30d is formed from the semiconductor film 36. The second semiconductor portion 30d is connected to the second electrodes 30a, 30b via the second diode-side holes 30c1, 30c2. The first shorting line 31 shorts out one of the first electrodes 29a, 19b and one of the second electrodes 30a, 30b. The second shorting line 33 shouts out the other one of the first electrode 29a, 29b and the other second electrode 30a, 30b. According to this configuration, the first electrode 29a of the first diode 29 and the second electrode 30a of the second diode 30 are shorted out by the first shorting line 31. Furthermore, the first electrode 29b of the first diode 29 and the second electrode 30b of the second diode 30 are shorted out by the second shorting line 33. If a large potential difference occurs between the common line 25 and the first shorting line 31 due to the static, a current is routed to the first semiconductor portion 29d of the first diode 29 or the second semiconductor portion 30d of the second diode 30. This compensates the potential difference.

Furthermore, the first gate electrode-side insulator (a gate electrode-side insulator) 43, the first gate electrode (a gate electrode) 29e, the second gate electrode-side insulator (a second gate electrode-side insulator) 45, and the second gate electrode (a second gate electrode) 30e are provided. The first gate electrode-side insulator 43 is formed from the protection film 37 and the gate insulator 35. The first gate electrode-side insulator 43 includes first gate electrode-side hole (a gate electrode-side hole) 43a that is a through hole formed at the position that overlaps the first shorting line 31. The first gate electrode 29e is included in the first diode 29 and formed from the first metal film 34. The first gate electrode 29e is arranged so as to overlap at least portions of the first electrodes 29a, 29b, the first semiconductor portion 29d, and the first shorting line 31 in a plan view. The first gate electrode 29e is connected to the first shorting line 31 via the first gate electrode-side hole 43a. The second gate electrode-side insulator 45 is formed from the protection film 37 and the gate insulator 35. The second gate electrode-side insulator 45 includes the second gate electrode-side hole (a second gate electrode-side hole) 45a that is a through hole formed at the position that overlaps the first shorting line 31. The second gate electrode 30e is included in the second diode 30. The second gate electrode 30e is formed from the first metal film 34. The second gate electrode 30e is arranged so as to overlap at least portions of the second electrodes 30a, 30b, the second semiconductor portion 30d, and the second shorting line 33 in a plan view. The second gate electrode 30e is connected to the second shorting line 33 via the second gate electrode-side hole 45a. The first gate electrode 29e is shorted to the first electrode 29a and the second electrode 30a by the first shorting line 31. Furthermore, the second gate electrode 30e is shorted to the first electrode 29b and the second electrode 30b by the second shorting line 33. The first diode 29 and the second diode 30 have transistor configurations. However, the static can be dissipated to the common line 25 only when the static is built up by setting the threshold voltage higher than the voltage of the signal transmitted through the signal line but lower than the voltage applied to the first diode 29 or the second diode 30 when the static is built up. Furthermore, the second gate electrode 30e is connected to the common line-side connecting portion 46 via the second shorting line 33. In comparison to a configuration in which the second gate electrode continues from the common line-side connecting portion 46, malfunctions of the first diode 29 and the second diode 30 due to static drawn to the static dissipating portion 52 are less likely to occur.

Furthermore, the gate lines (signal lines) 19, the gate line-side connecting portions (signal line-side connecting portion) 48, the contact portion-side insulators 49, and the contact portions 32 are provided. The gate lines 19 are formed from the first metal film 34. Each gate line 19 is arranged on an opposite side from the first diode 29 relative to the common line 25. The gate line-side connecting portions 48 are formed from the first metal film 34. The gate line-side connecting portions 48 are formed at ends of the respective gate lines 19. The contact portion-side insulators 49 are formed from the protection film 37 and the gate insulator 35. Each of the contact portion-side insulators 49 includes the contact portion-side holes 49a that are through holes formed at the positions overlapping the gate line-side connecting portion 48. The contact portions 32 are formed from the second metal film 38. Each of the contact portions 32 at least includes the diode-side connecting portion (a semiconductor component-side connecting portion) 50. The diode-side connecting portion 50 is formed at the end of the first shorting line 31 so as to overlap the gate line-side connecting portion 48 in a plan view. The diode-side connecting portion 50 is connected to the gate line-side connecting portion 48 via the contact portion-side hole 49a. According to this configuration, the gate line-side connecting portion 48 of the gate line 19 is connected to the diode-side connecting portion 50 via the contact portion-side hole 49a and signals from the first diode 29 are supplied to the gate line 19. The gate line 19 is formed from the first metal film 34. The gate line-side connecting portion 48 is formed at the end of the gate line 19 in the contact portion 32. The diode-side connecting portion 50 is formed from the second metal film 38 and at the end of the first shorting line 31 that continues from one of the first electrodes 29a, 29b of the first diode 29. The contact portion-side hole 49a is a through hole formed in the contact portion-side insulator 49.

Furthermore, the static dissipating projections 56 are formed in the portions of the gate line-side connecting portion 48 and the common line 25 opposite to each other. The static dissipating projections 56 project toward each other to dissipate the static. In the fabrication process of the array board 11b, even if static is built up in one of the first diode 29 and the contact portion 32, the static is dissipated to the static dissipating projection 56 in a path toward the other one of the first diode 29 and the contact portion 32. With this configuration, a malfunction due to the static in the first diode 29 or the contact portion 32 is further less likely to occur.

The liquid crystal panel (a display device) 11 in this embodiment includes the array board 11b described above, the CF board (a counter substrate), the liquid crystal layer 11c, and the TFTs (switching components) 17. The CF board 11a is arranged opposite the array board 11b. The liquid crystal layer 11c is arranged between the array board 11b and the counter substrate 11a. The TFTs 17 are disposed on the array board 11b and connected to at least the first diodes 29. Because the array board 11b described above is less likely to cause a malfunction due to static, the liquid crystal panel 11 has high operation reliability.

Second Embodiment

A second embodiment according to the present invention will be described with reference to FIG. 15. The second embodiment includes diodes 129, 130 that include gate non-overlapping-type static dissipating portions 57, 58, respectively. Similar configurations, operations, and effects to the first embodiment described above will not be described.

Figure 15:
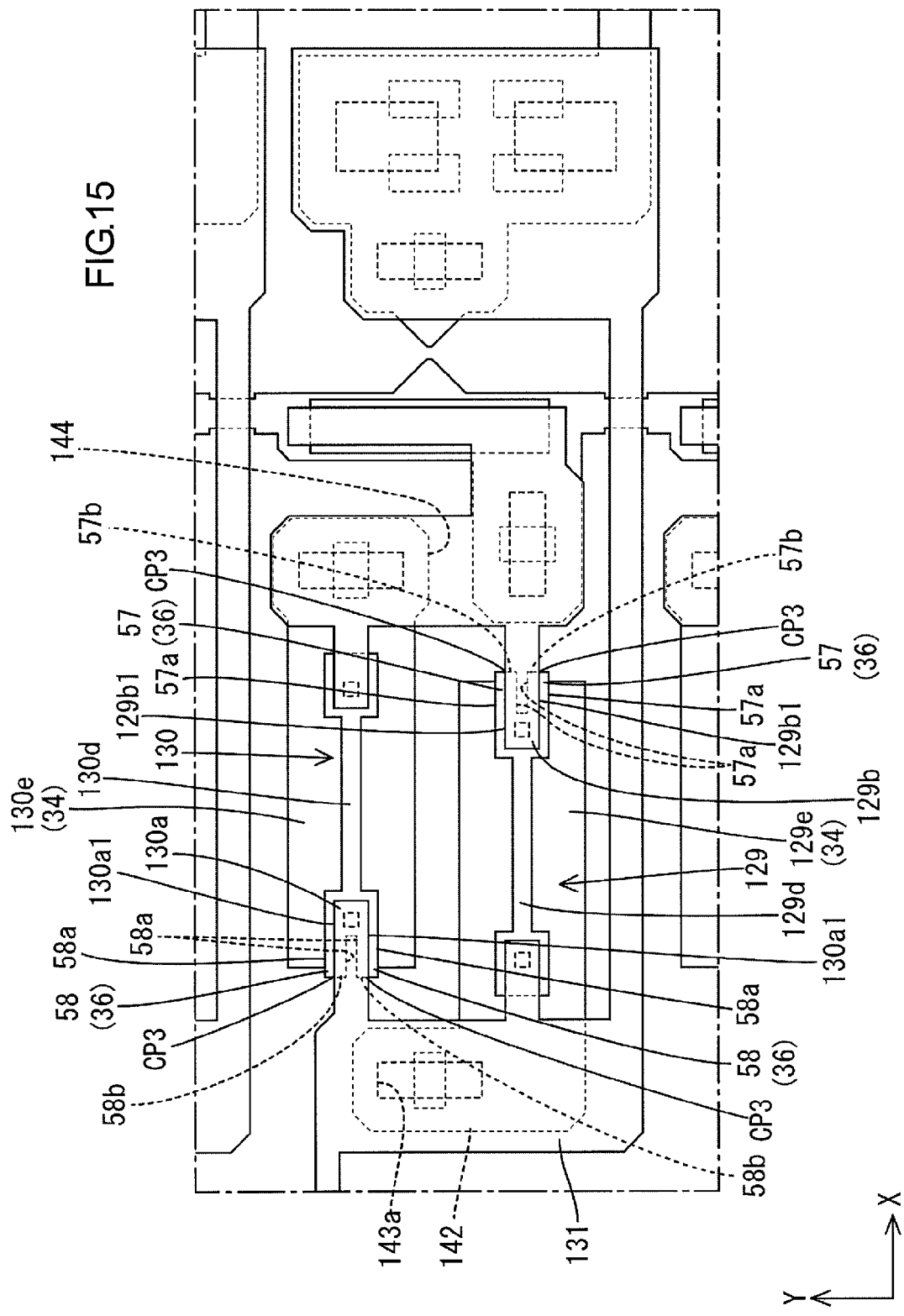
FIG. 15 is a plan view of an array board illustrating a static protection circuit portion, a common line, a static protection portion, and a contact portion according to a second embodiment of the present invention.

As illustrated in FIG. 15, the diodes 129, 130 in this embodiment include the gate non-overlapping-type static dissipating portions 57, 58 that continue from semiconductor portions 129d, 130d, respectively. The gate non-overlapping-type static dissipating portions 57, 58 are arranged at positions that do not overlap gate electrodes 129e, 130e, respectively, in a plan view. The gate non-overlapping-type static dissipating portions 57, 58 continue from semiconductor portions 129d, 130d, respectively. The gate non-overlapping-type static dissipating portions 57, 58 include outer edges 57b, 58b that cross outer edges 129b1, 130a1 of the electrodes 129b, 130b, respectively, in a plan view. The first gate non-overlapping-type static dissipating portions 57 of the first diode 129 extend from an edge of the first semiconductor portion 129d overlapping the first electrode 129b in a plan view to a position that does not overlap the first gate electrode 129e. The edge of the first semiconductor portion 129d is located at an end of first gate electrode 129e opposite from a first shorting line-side connecting portion 142 (on the right side in FIG. 15). The first gate non-overlapping-type static dissipating portions 57 extend in the X-axis direction (a longitudinal direction of the first semiconductor portion 129d). The first gate non-overlapping-type static dissipating portions 57 continue from the end of the first semiconductor portion 129d at ends of the width of the first semiconductor portion 129d (ends thereof in the Y-axis direction). Namely, the first gate non-overlapping-type static dissipating portions 57 are formed like branches in a plan view. The first gate non-overlapping-type static dissipating portions 57 include outer edges 57a that extend in the longitudinal direction thereof (the X-axis direction). The outer edges 57a are in line with the respective outer edges of the first semiconductor portion 129d. The first gate non-overlapping-type static dissipating portions 57 include outer edges 57b that extend in the width direction thereof (the Y-axis direction). The outer edges 57b are perpendicular to (or cross) the outer edges 129b1 of the first electrode 129b. The outer edges 129b1 extend in the X-axis direction. Intersections CP3 of the outer edges 57b and the respective outer edges 129b1 are not located over the first gate line 129e, that is, so as not to overlap.

The second gate non-overlapping-type static dissipating portions 58 of the second diode 130 extend from an edge of the second semiconductor portion 130d overlapping the second electrode 130a in a plan view to a position that does not overlap the second gate electrode 130e. The edge of the second semiconductor portion 130d is located at an end of second gate electrode 130e opposite from a second shorting line-side connecting portion 144 (on the left side in FIG. 15). The second gate non-overlapping-type static dissipating portions 58 extend in the X-axis direction (a longitudinal direction of the second semiconductor portion 130d). The second gate non-overlapping-type static dissipating portions 58 continue from the end of the second semiconductor portion 130d at ends of the width of the second semiconductor portion 130d (ends thereof in the Y-axis direction). Namely, the second gate non-overlapping-type static dissipating portions 58 are formed like branches in a plan view. The second gate non-overlapping-type static dissipating portions 58 include outer edges 58a that extend in the longitudinal direction thereof (the X-axis direction). The outer edges 58a are in line with the respective outer edges of the second semiconductor portion 130d. The second gate non-overlapping-type static dissipating portions 58 include outer edges 58b that extend in the width direction thereof (the Y-axis direction). The outer edges 58b are perpendicular to (or cross) the outer edges 130a1 of the second electrode 130a. The outer edges 130a1 extend in the X-axis direction. Intersections CP3 of the outer edges 58b and the respective outer edges 130a1 are not located over the second gate line 130e, that is, so as not to overlap.

As described above, the outer edges 57b, 58b of the gate non-overlapping-type static dissipating portions 57, 58 cross the respective outer edges 129b1, 130a1 of the electrodes 129b, 130a in a plan view at the positions that do not overlap the gate electrodes 129e, 130e in a plan view. According to this configuration, coverage of the protection film 37 and the gate insulator 35 (not illustrated) arranged in the lower layers decreases at the intersections CP3 and thus insulating performance decreases. Therefore, static that is built up in the fabrication process of the array board is dissipated to the intersections CP3. Even if the static is applied to the intersections CP3, the gate electrodes 129e, 130e are not located at the intersections CP3 in a plan view and thus the electrodes 129b, 130a are not shorted to the gate electrodes 129e, 130e.

As described above, this embodiment includes the first gate electrode-side insulators (not illustrated), the first gate electrodes 129e, and the first gate non-overlapping-type static dissipating portions (gate non-overlapping-type static dissipating portions) 57. Each of the first gate electrode-side insulators is formed from the protection film 37 and the gate insulator 35. The first gate electrode-side insulator includes the first gate electrode-side hole 143a that is a through hole formed at the position overlapping the first shorting line 131. The first gate electrodes 129e are included in the first diodes 129, respectively. Each of the first gate electrodes 129e is formed from the first metal film 34 and arranged so as to overlap at least portions of the first electrodes 129a, 129b and the first semiconductor portion 129d in a plan view. The first gate electrode 129e is connected to the first shorting line 131 via the first gate electrode-side hole 143a. The first gate non-overlapping-type static dissipating portions 57 continue from the respective first semiconductor portion 129d. Each of the first gate non-overlapping-type static dissipating portions 57 includes the outer edge 57b that crosses the outer edge 129b1 of the first electrode 129b among the first electrodes 129a, 129b in a plan view at the position that does not overlap the first gate electrode 129e. In this configuration, the outer edge 129b1 of the first electrode 129b among the first electrodes 129a, 129b of the first diode 129 crosses the outer edge 57b of the first gate non-overlapping-type static dissipating portion 57 that is formed from the semiconductor film 36 in a plan view. According to this configuration, the coverage of the protection film 37 and the gate insulator 35 arranged in the lower layers decreases at the intersections CP3 and thus the insulating performance decreases. Therefore, the static is dissipated to the intersection CP3. Furthermore, the intersection CP3 of the outer edge 129b1 of the electrode 129b and the outer edge 57b of the first gate non-overlapping-type static dissipating portion 57 is located at the position that does not overlap the first gate electrode 129e in a plan view. Even if the static is applied to the intersection CP3, the electrode 129b is not shorted to the first gate electrode 129e.

Third Embodiment

A third embodiment according to the present invention will be described with reference to FIGS. 16 to 19. The third embodiment includes static dissipating portions 252 configured to dissipate static that is built up in a stage before the second metal film 38 is formed. Similar configurations, operations, and effects to the first embodiment will not be described.

Figure 16:
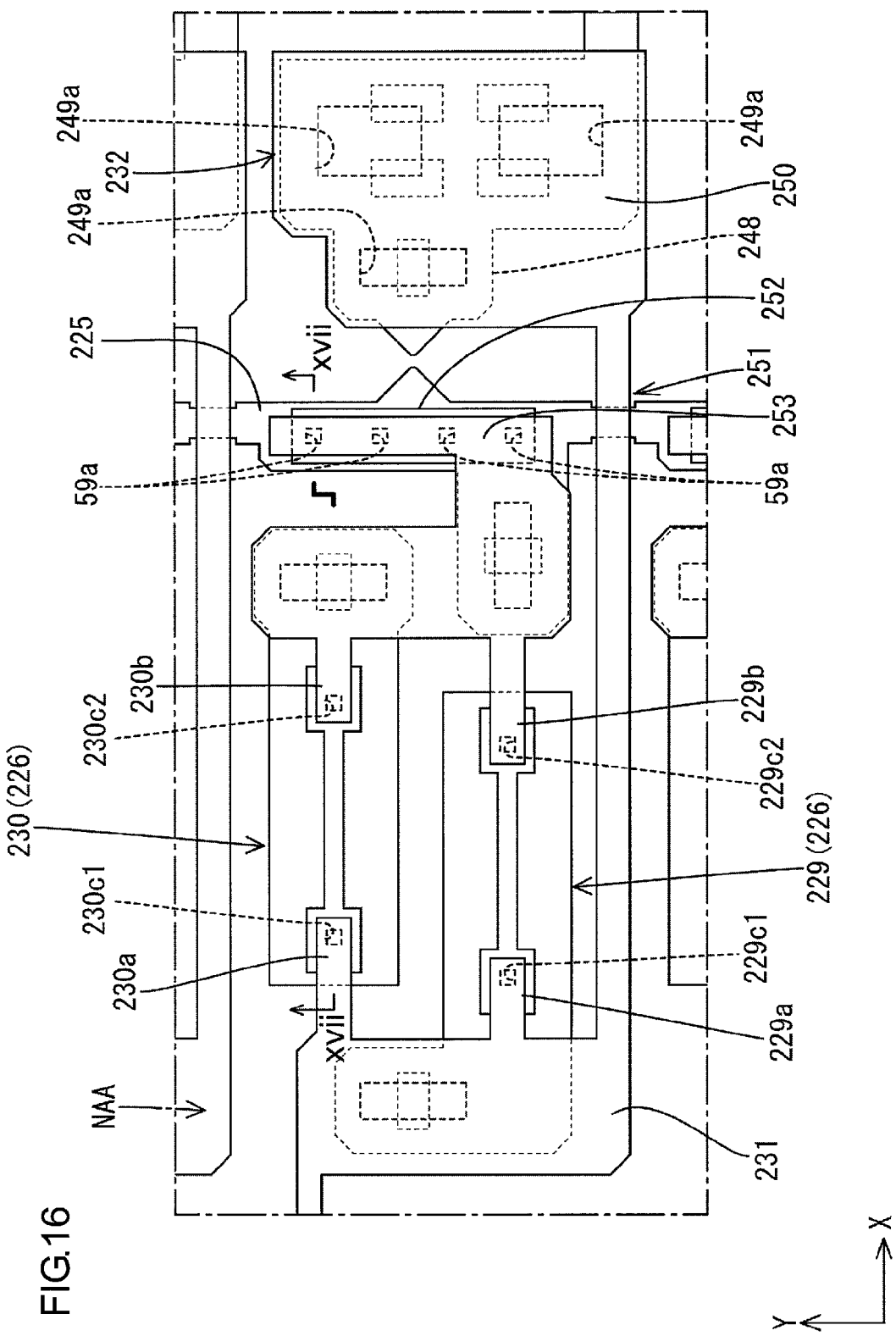
FIG. 16 is a plan view of an array board illustrating a static protection circuit portion, a common line, a static protection portion, and a contact portion according to a third embodiment of the present invention.
Figure 17:
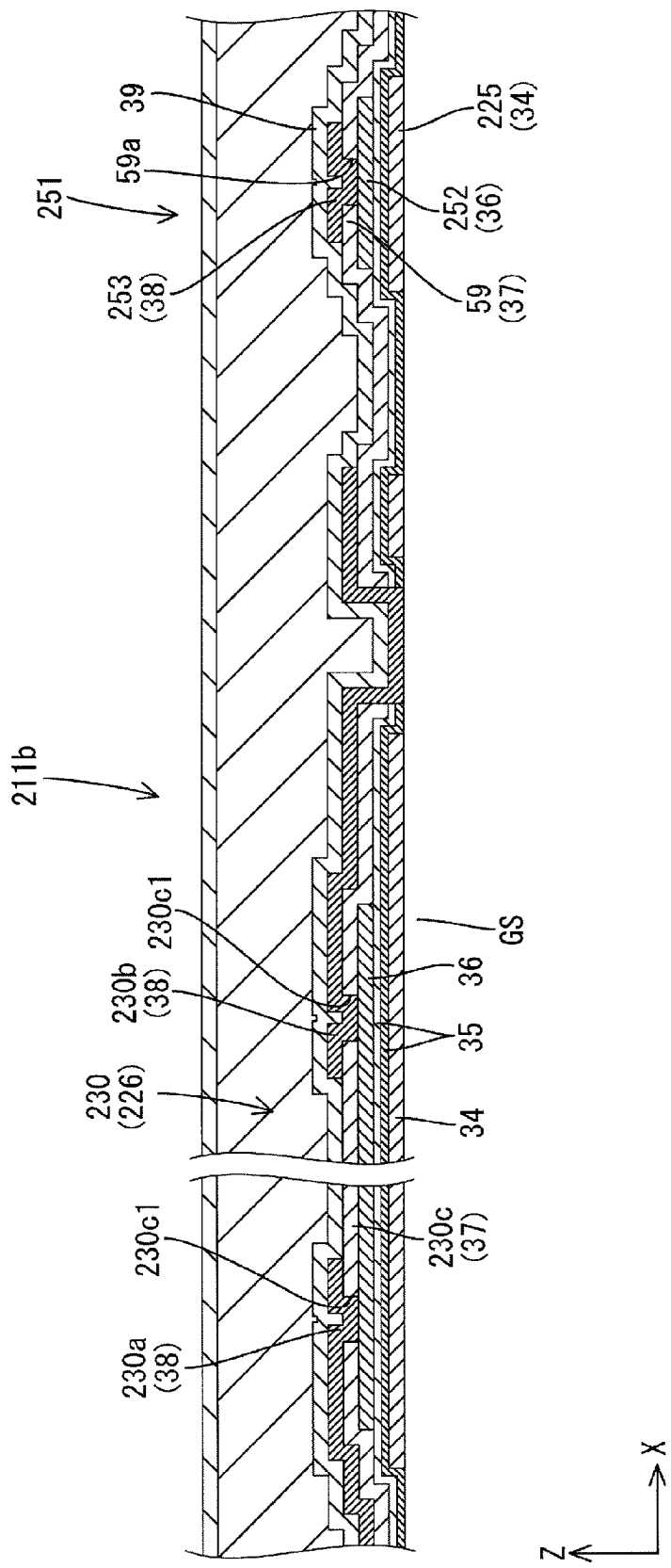
FIG. 17 is a cross-sectional view of FIG. 16 along line xvii-xvii.

As illustrated in FIGS. 16 and 17, the protection film 37 in this embodiment arranged between each of the static dissipating portions 252 and a second static dissipating portion 253 forms a dissipating portion protecting portion 59 that includes static dissipating holes 59a that are through holes. The second static dissipating portion 253 is connected to the static dissipating portion 252 through the static dissipating holes 59a. According to this configuration, the static dissipating portion 252 is less likely to be exposed on the first interlayer insulation film 39 side through the static dissipating holes 59a.

As illustrated in FIGS. 16 and 17, the dissipating portion protecting portion 59 is arranged so as to cover a large portion of the static dissipating portion 252 except for portions in which the static dissipating holes 59a are formed. Four static dissipating holes 59a are formed at intervals along an extending direction of the static dissipating portion 252 (the Y-axis direction). The intervals of the static dissipating holes 59a are about equal. Two out of four static dissipating holes 59a located at the ends of the Y-axis dimension are arranged outer than first electrodes 229a, 229b (first diode-side holes 229c1, 229c2) and second electrodes 230a, 230b (second diode-side holes 230c1, 230c2) of a static protection circuit portion 226 with respect to the Y-axis direction (closer to portions of first shorting lines 231 extending along the X-axis direction). In the plan view in FIG. 16, a line that connects four static dissipating holes 59a described above crosses a line that connects the diode-side holes 229c1, 229c2, 230c1, 230c2 of the static protection circuit 226 and a line that connects three contact portion-side holes 249a of a contact portion 232.

Figure 18:
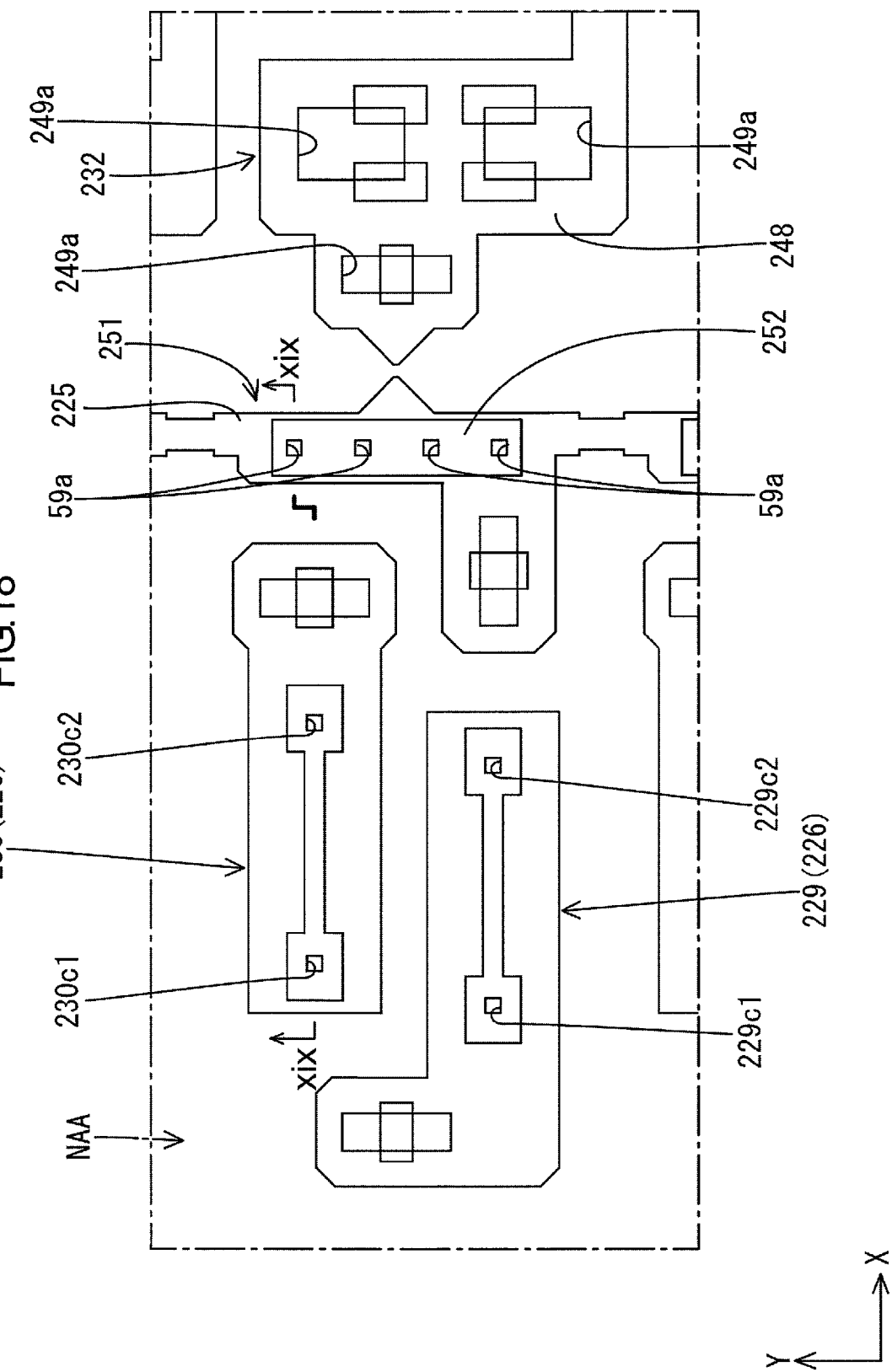
FIG. 18 is a plan view the array board before a second metal film is formed illustrating the static protection circuit portion, the common line, the static protection portion, and the contact portion.
Figure 19:
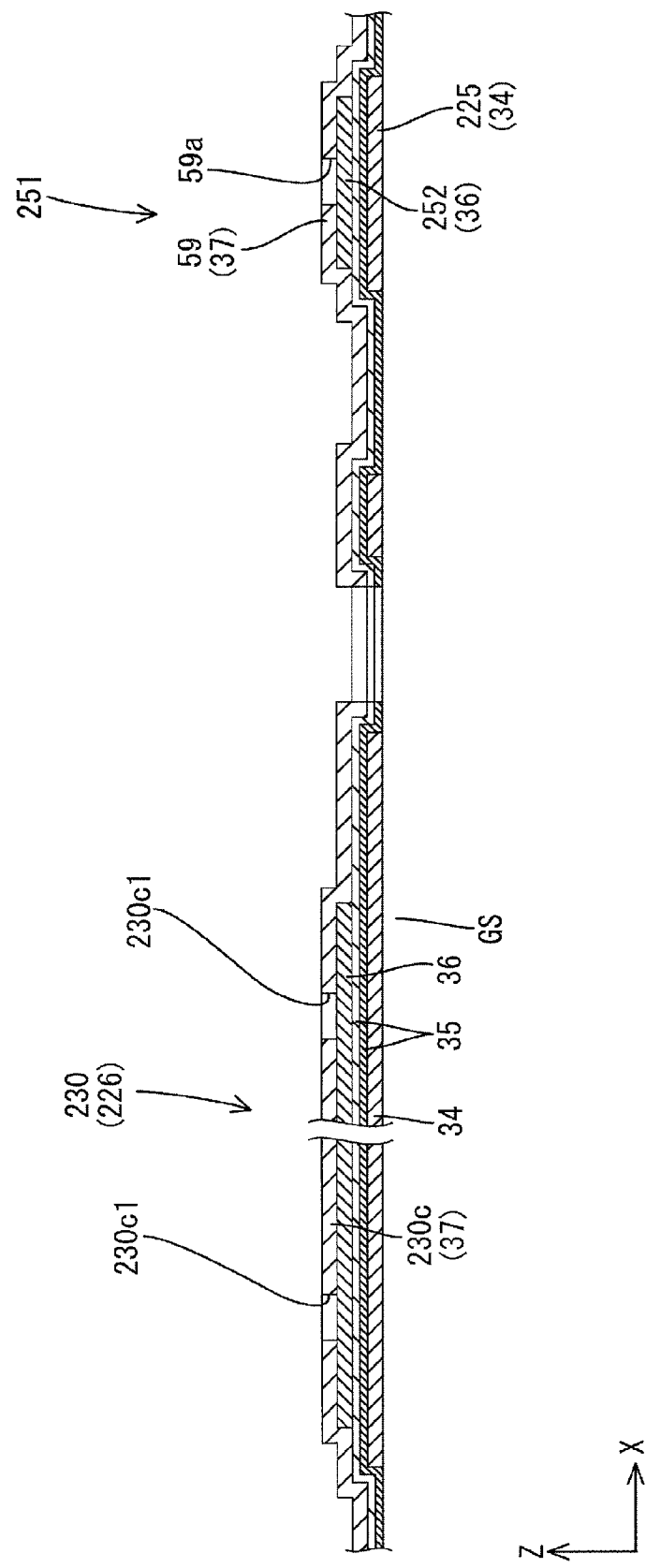
FIG. 19 is a cross-sectional view of FIG. 18 along line xix-xix.

According to the configuration in which the static dissipating holes 59a are formed in the protection film 37 that is arranged between the static dissipating portion 252 and the second static dissipating portion 253, the following functions and effects are achieved. In a fabrication process of an array board 211b, the films described earlier are formed on a glass substrate GS in sequence from the lower layer by a known photolithography method. When the first metal film 34, the gate insulator 35, the semiconductor film 36, and the protection film 37 are formed on the glass substrate GS, the semiconductor portions 229d, 230d of the static protection circuit portion 226 are exposed to the outside via the diode-side holes 229c1, 229c2, 230c1, 230c2 of the protection portion 229c, 230c in the non-display area NAA as illustrated in FIGS. 18 and 19. Furthermore, gate line-side connecting portion 248 of the contact portion 232 is exposed to the outside via three contact portion-side holes 249a of a contact portion-side insulator (not illustrated, see FIG. 11). While the glass substrate GS in this stage is transferred to different machines until the second metal film 38 is formed, static may be built up on the glass substrate GS or the outermost surface of the formed films due to peeling electrostatic charge. Although the surface of the glass substrate GS is covered with the protection film 37 mainly made of insulating material, the semiconductor portions 229d, 230d and the gate line-side connecting portion 248 made of conductive material via the holes 229c1, 229c2, 230c1, 230c2, 249a in the non-display area NAA. Therefore, static may be applied to the semiconductor portion 229d, 230d by the gate line-side connecting portion 248 or to the gate line-side connecting portion 248 by the semiconductor portion 229d, 230d.

In this embodiment, as illustrated in FIG. 18, the static protection portion 251 is formed between the static protection circuit portion 226 and the contact portion 232. As illustrated in FIG. 19, the static dissipating portion 252 of the static protection portion 232 is exposed to the outside via the static dissipating holes 253a. The static that may be applied to one of each semiconductor portion 229d, 230d and the gate line-side connecting portion 248 by the other one of each semiconductor portion 229d, 230d and the gate line-side connecting portion 248 is dissipated to the static dissipating portion 252 via the static dissipating holes 253a. According to this configuration, shorting of the semiconductor portions 229d, 230d to the gate electrodes 229a, 230a due to electrostatic breakdown of the diodes 229, 230 is less likely to occur. Furthermore, disconnection between the gate line-side connecting portion 248 and a diode-side connecting portion 250 due to electrostatic breakdown of the contact portion 232 is less likely to occur. The static dissipating portion 252 is formed from the semiconductor film 36 that also forms the semiconductor portions 229d, 230d of the diodes 229, 230. If static is built up in the gate line-side connecting portion 248 of the contact portion 232, the static is effectively dissipated by the static dissipating portion 252. Therefore, application of the static to the semiconductor portions 229d, 230d is further properly restricted. If the static is drawn to the static dissipating portion 252, electrostatic breakdown may occur and the static dissipating portion 252 may be shorted to a common line 225. If that occurs, the static is dissipated to the common line 225.

Fourth Embodiment

A fourth embodiment according to the present invention will be described with reference to FIGS. 20 and 21. The fourth embodiment includes static dissipating portions 352 each having a shape different from that of the second static dissipating portions 53 of the first embodiment, which are not included in this embodiment. Similar configurations, operations, and effects to the first embodiment will not be described.

Figure 20:
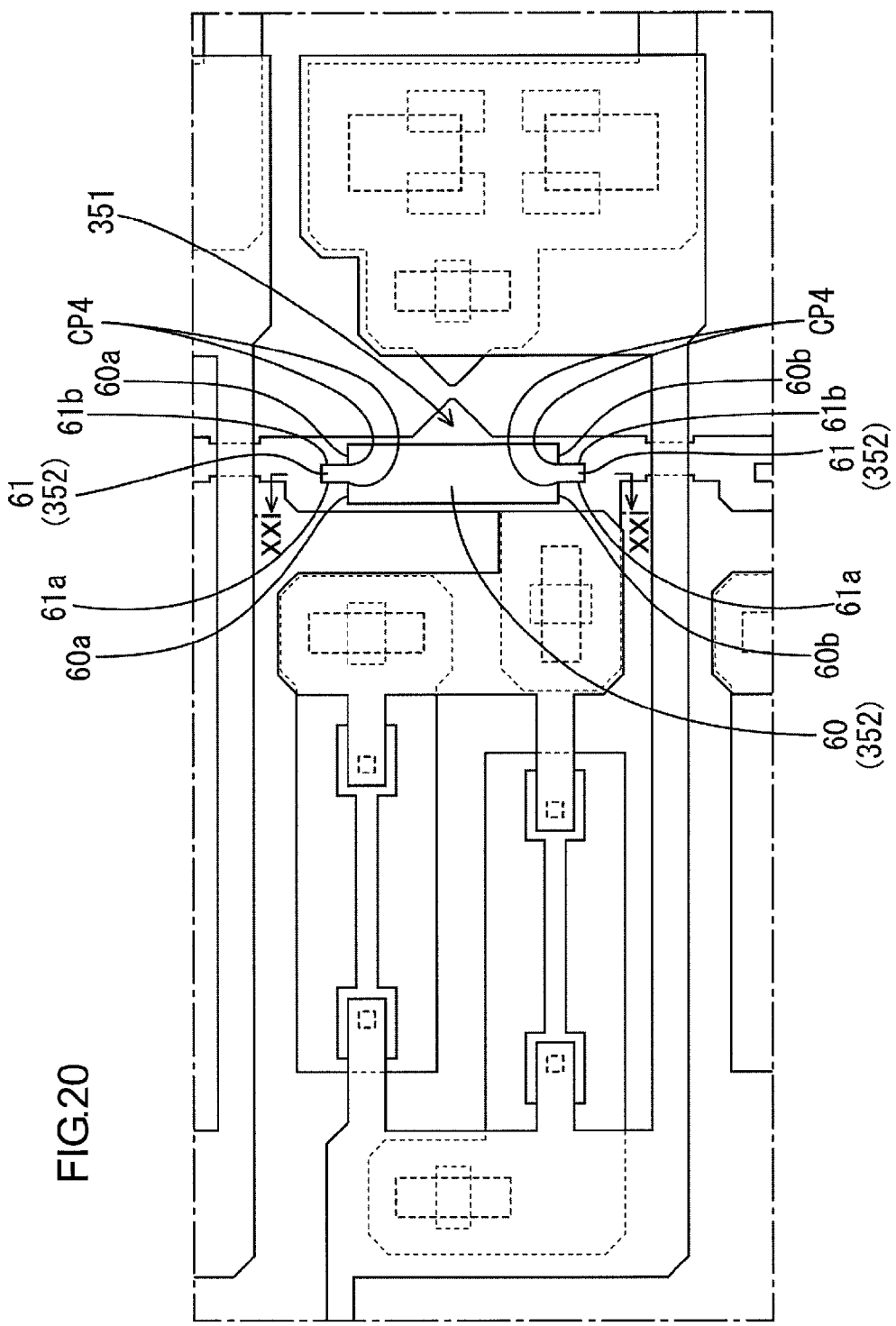
FIG. 20 is a plan view of an array board illustrating a static protection circuit portion, a common line, a static protection portion, and a contact portion according to a fourth embodiment of the present invention
Figure 21:
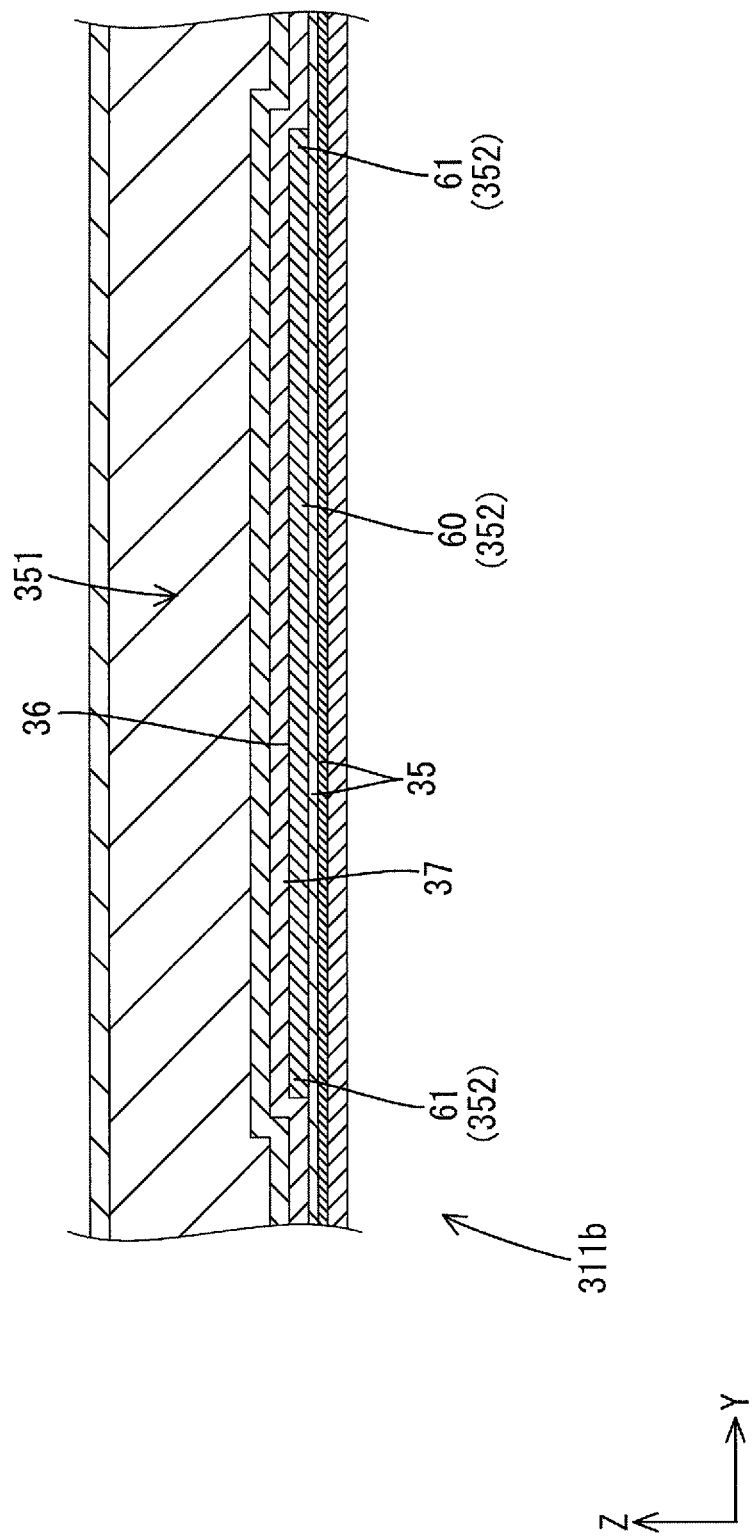
FIG. 21 is a cross-sectional view of FIG. 20 along line xxi-xxi.

As illustrated in FIG. 20, each of static protection portions 351 in this embodiment includes the static dissipating portion 352 but does not include the second static dissipating portion 53 of the first embodiment. The static dissipating portion 352 includes a rectangular portion 60 and a pair of projecting portions 61. The rectangular portion 60 has a vertically-long rectangular shape in a plan view. The projecting portions 61 project from short outer edges 60a, 60b of the rectangular portion 60 in the Y-axis direction, respectively. The short outer edges 60a, 60b of the rectangular portion 60 are parallel to the X-axis direction. Outer edges 61a, 61b of each projecting portion 61 continuing from the short outer edges 60a, 60b of the rectangular portion 60, respectively, are parallel to the Y-axis direction and perpendicular to (or cross) the short outer edges 60a, 60b of the rectangular portion 60. An angle formed by each short outer edge 60a of the rectangular portion 60 and the outer edge 61a of the corresponding projecting portion 61 at the intersection CP4 is about 270 degrees. An angle formed by each short outer edge 60b of the rectangular portion 60 and the outer edge 61b of the corresponding projecting portion 61 at the intersection CP4 is about 270 degrees. Coverage of the gate insulator 35 and the protection film 37 arranged in the lower layers decreases at the intersections CP4 and insulating performance decreases. Therefore, the static that is built up in the fabrication process of the array board 311b is more likely to be dissipated to the intersections CP4.

Fifth Embodiment

A fifth embodiment according to the present invention will be described with reference to FIG. 22. The fifth embodiment includes second shorting lines 433 and second static dissipating portions 453 that are separated from the respective second shorting lines 433. Similar configurations, operations, and effects to the first embodiment will not be described.

Figure 22:
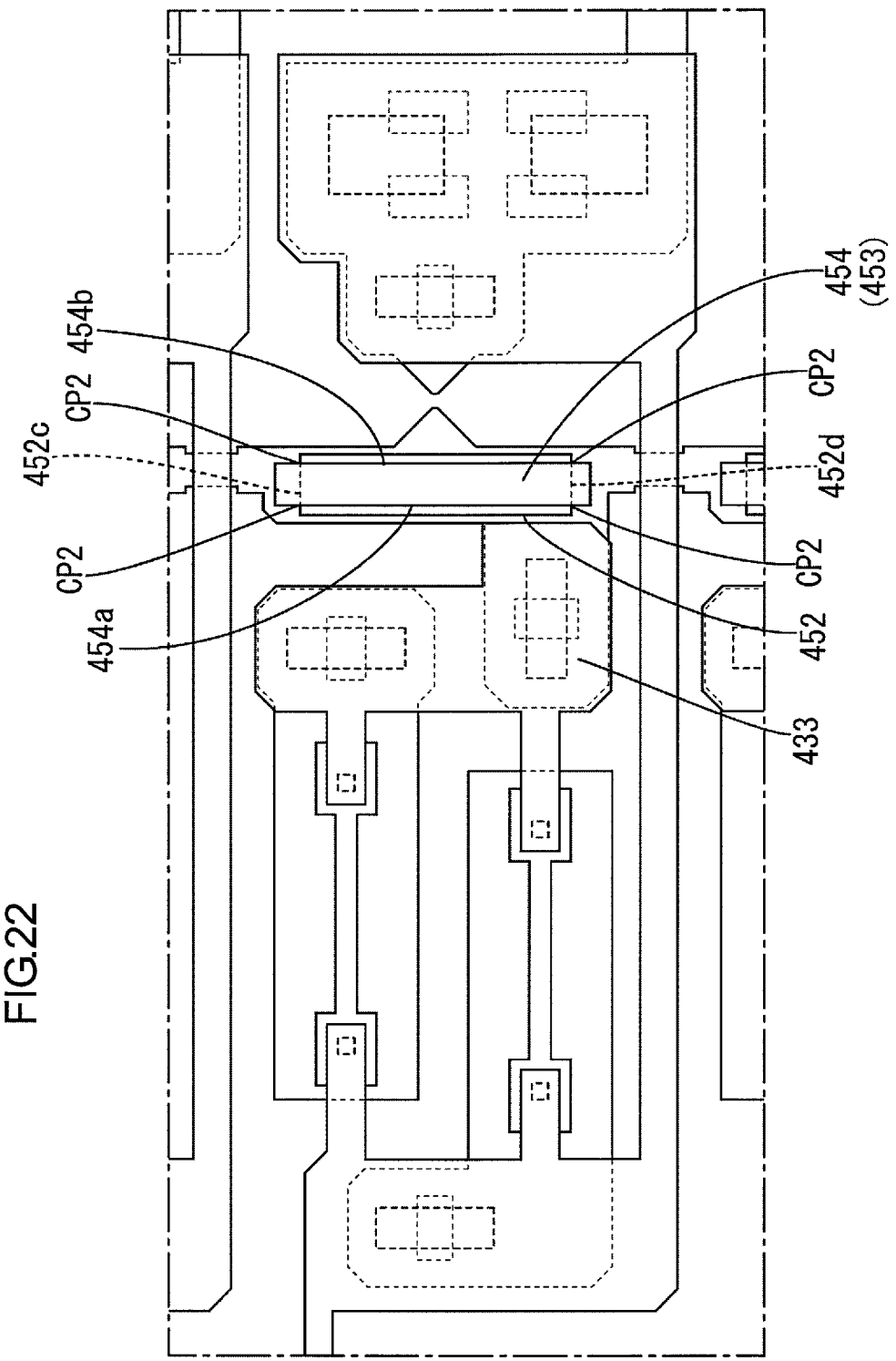
FIG. 22 is a plan view of an array board illustrating a static protection circuit portion, a common line, a static protection portion, and a contact portion according to a fifth embodiment of the present invention

As illustrated in FIG. 22, each of the second static dissipating portions 453 in this embodiment includes only a rectangular portion 454 and does not include the projecting portion 55 of the first embodiment. The second static dissipating portion 453 is separated from the second shorting line 433. The second static dissipating portion 453 includes a pair of long outer edges 454a, 454b, each of which crosses short outer edges 452c, 452d of a static dissipating portion 452 at two points. Namely, there are four intersections CP2 at which the outer edges 452c, 452d of the static dissipating portion 452 cross the outer edges 454a, 454b of the second static dissipating portion 453. The intersections CP2 are symmetric with respect to the X-axis direction and the Y-axis direction.

Sixth Embodiment

A sixth embodiment according to the present invention will be described with reference to FIGS. 23 and 24. The sixth embodiment has the same configuration as the first embodiment except for the static dissipating portions 52, which is not included in this embodiment. Similar configurations, operations, and effects to the first embodiment will not be described.

Figure 23:
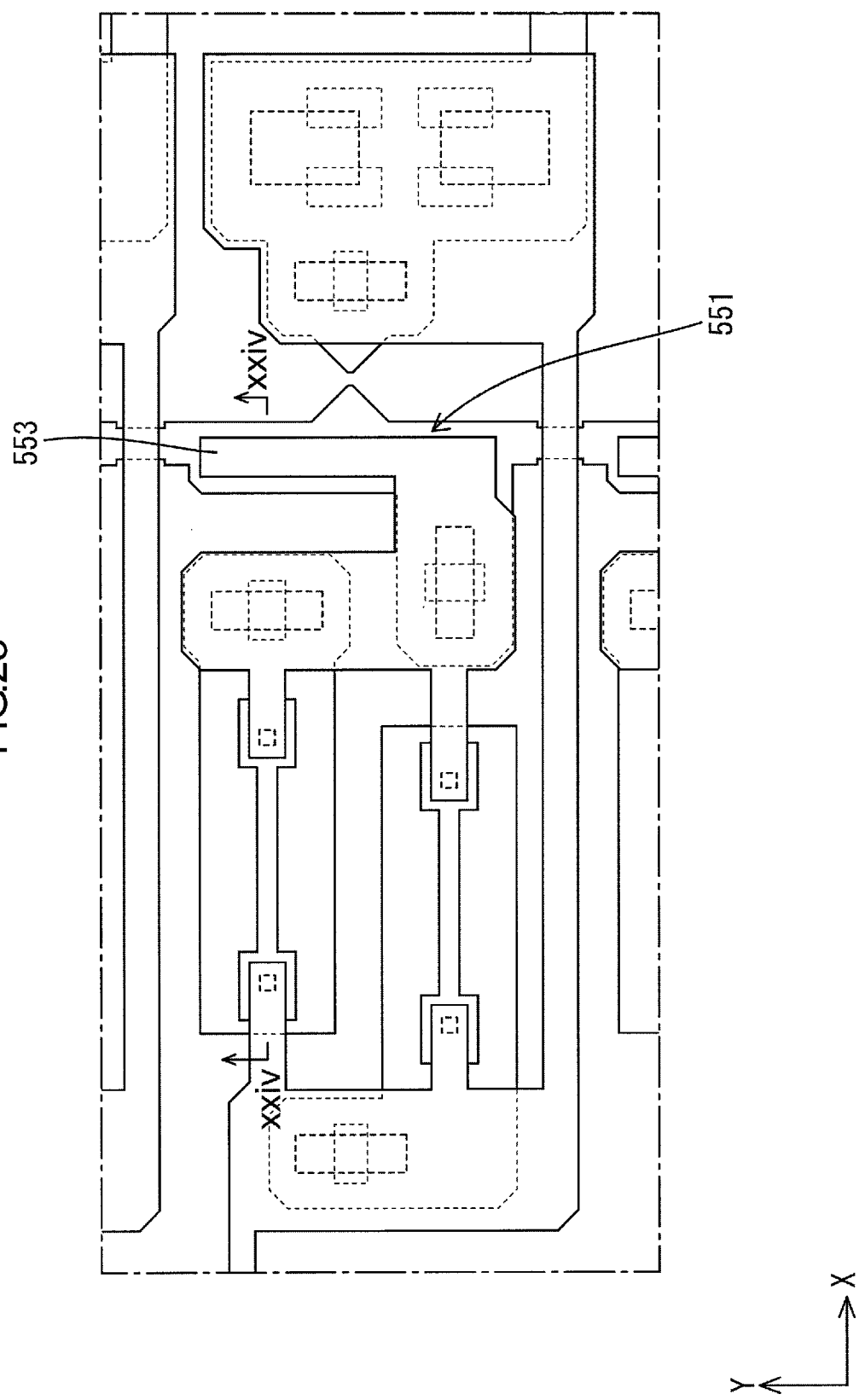
FIG. 23 is a plan view of an array board illustrating a static protection circuit portion, a common line, a static protection portion, and a contact portion according to a sixth embodiment of the present invention
Figure 24:
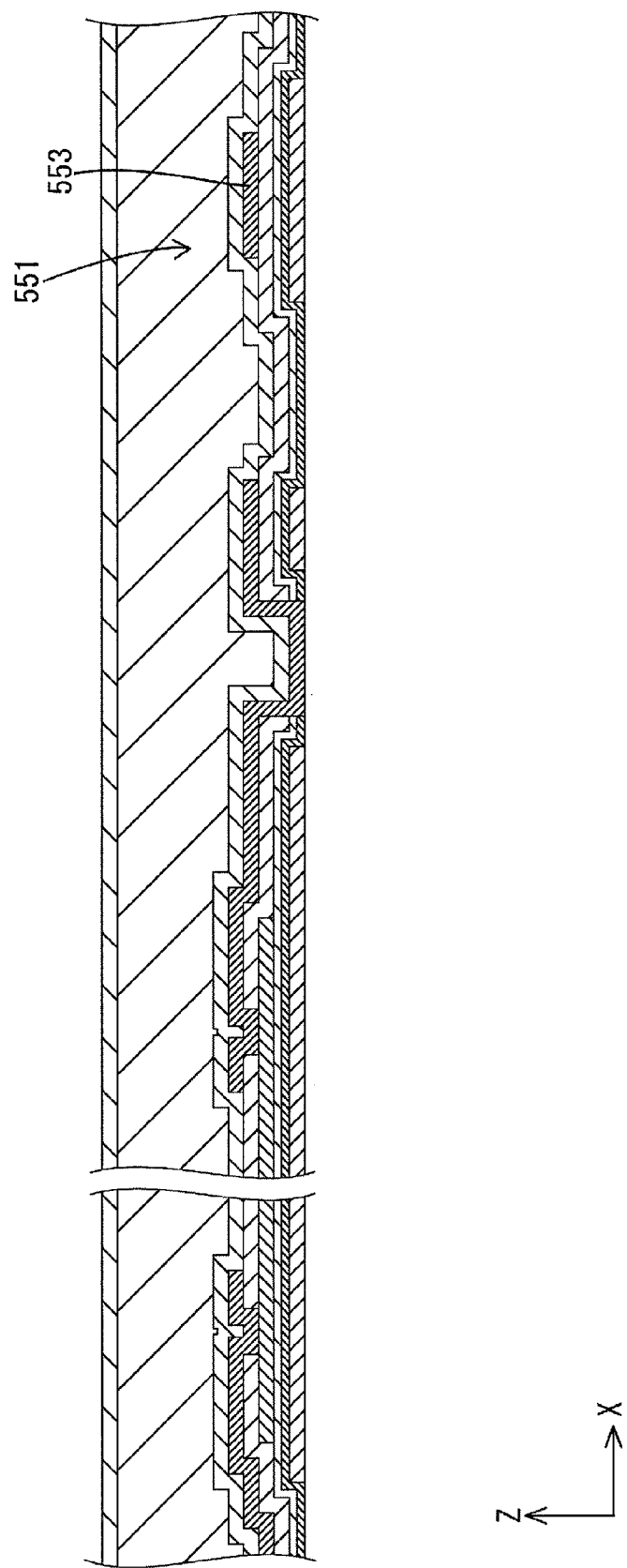
FIG. 24 is a cross-sectional view of FIG. 23 along line xxiv-xxiv.

As illustrated in FIGS. 23 and 24, a static protection portion 551 in this embodiment includes a second static dissipating portion 553 but does not include the static dissipating portion 52 of the first embodiment. Even with this configuration, static is properly dissipated by the second static dissipating portion 553.

Other Embodiments

The present invention is not limited to the embodiments described above and illustrated by the drawings. For examples, the following embodiments will be included in the technical scope of the present invention.

(1) Each of the above embodiments includes the diodes having a TFT configuration as static protection circuit components (semiconductor component) in the static protection circuit portions. Instead of such diodes, zener diodes or varistors may be used. In that case, each of the static protection circuit components (zener diodes or varistors) may include two electrodes, a protection portion having two semiconductor component-side holes, a semiconductor portion that is connected to the electrodes via the semiconductor component-side holes but may not include a gate electrode.

(2) The number, the plan-view size (the X-axis dimension and the Y-axis dimension of the area of formation), the plan-view shape of the static dissipating portions and those of the second dissipating portions may be altered from the above embodiments as appropriate. The number of intersections at which the outer edges cross each other may be altered from the above embodiments as appropriate. For example, regarding the plan-view size, the width of the static dissipating portion may be smaller than the width of the second static dissipating portion and the length of the static dissipating portion may be larger than the length of the second static dissipating portion. Regarding the plan-view shape, the static dissipating portion may have a triangular plan view shape and the second static dissipating portion may have a rectangular plan-view shape. Regarding the number of intersections of the outer edges, the number may be set to three or smaller or five or larger.

(3) In each of the above embodiments, each of the static dissipating portions overlaps the common line for the entire area thereof. However, the static dissipating portion may include an overlapping portion that overlap the common line and a non-overlapping portion that does not overlap the common line.

(4) The number, the plan-view size (the area of formation), and the plan-view shape of the static dissipating holes in the third embodiment may be altered as appropriate.

(5) The plan-view shape of the static dissipating portions in the fourth embodiment may be altered to the same shape as the static dissipating portions in the first embodiment.

(6) In each of the above embodiments, each second shorting line-side connecting portion that continues from the corresponding second gate electrode is separated from the common line. The second shorting line-side connecting portion is connected to the common line via the second shorting line and the common line-side connecting portion. However, the second shorting line-side connecting portion may be directly connected to the common line, that is, the second shorting line-side connecting portion may be configured to function as the common line-side connecting portion. In that case, the second gate electrode-side insulator may function as the second shorting line-side insulator and the second gate electrode-side hole may be function as the second shorting line-side hole.

(7) In each of the above embodiments, each of the static protection circuit portions is electrically connected to the common line. However, the static protection circuit portion may not be electrically connected to the common line. One of the electrodes of each diode in the static protection circuit portion is connected to the first shorting line. The other electrode may be connected to another first shorting line that is arranged opposite from the first shorting line to which the one of the electrodes is connected to dissipate static to the other first shorting line.

(8) In each of the above embodiments, the oxide semiconductor used for the semiconductor film is an oxide thin film that contains indium (In), gallium (Ga), and zinc (Zn). However, other types of oxide semiconductors may be used. Examples of oxides include an oxide that contains indium (In), silicon (Si), and zinc (Zn), an oxide that contains indium (In), aluminum (Al), and zinc (Zn), an oxide that contains tin (Sn), silicon (Si), and zinc (Zn), an oxide that contains tin (Sn), aluminum (Al), and zinc (Zn), an oxide that contains tin (Sn), gallium (Ga), and zinc (Zn), an oxide that contains gallium (Ga), silicon (Si), and zinc (Zn), an oxide that contains gallium (Ga), aluminum (Al), and zinc (Zn), an oxide that contains indium (In), copper (Cu), and zinc (Zn), and an oxide that contains tin (Sn), copper (Cu), and zinc (Zn).

(9) In the above embodiments, each of the TFTs, the column control circuits, and the row control circuits includes the oxide thin film that contains indium (In), gallium (Ga), and zinc (Zn) as a semiconductor film. However, a semiconductor film made of amorphous silicon (a-Si) or polysilicon may be used. For example, a continuous grain silicon thin film may be used.

(10) Each of the above embodiments includes the liquid crystal panel that includes an FFS mode as an operation mode. However, other liquid crystal panels are also included in the scope of the present invention, for example, a liquid crystal panel that includes an in-plane switching (IPS) mode or a vertical alignment (VA) mode as an operation mode is also included in the scope of the present invention.

(11) Each of the above embodiments includes the first metal film and the second metal film that are formed from a stacked film of titanium (Ti) and copper (Cu). However, the following materials may be used instead of titanium: molybdenum (Mo), molybdenum nitride (MoN), titanium nitride (TiN), tungsten (W), niobium (Nb), molybdenum-titanium alloy (MoTi), and molybdenum-tungsten (MoW) alloy. Furthermore, single-layered metal films such as titanium, copper, and aluminum films may be used.

(12) The plan-view shapes or the routing of the first shorting lines, the second shorting lines, and the common line may be altered from the above embodiment as appropriate. The arrangement of the diodes with respect the X-axis direction and the Y-axis direction, the arrangement of the electrodes of each diode, the width and the length of the semiconductor portion of each diode may be altered as appropriate. The arrangement of the number of the connecting points in the contact portions may be altered as appropriate.

(13) Each of the above embodiments includes the driver that is directly mounted on the array board through the COG method. A driver that is mounted on a flexible printed circuit board that is connected to the array board via an ACF is also included in the scope of the present invention.

(14) Each of the above embodiments includes the column control circuit and the row control circuit arrange in the non-display area of the array board. However, any one of the column control circuit and the row control circuit may be omitted, and the driver may be configured to perform the functions of the omitted circuit.

(15) Each of the above embodiments includes the liquid crystal panel having a vertically-long rectangular shape. However, liquid crystal panels having a horizontally-long rectangular shape of a square shape are also included in the scope of the present invention.

(16) Each of the above embodiments may further include a functional panel, such as a touch panel and a parallax barrier panel (a switching liquid crystal panel), layered and attached to the liquid crystal panel.

(17) The liquid crystal display device according to the above embodiments includes the edge-light type backlight unit. However, the liquid crystal display device may include a direct backlight unit.

(18) The transmission type liquid crystal display devices each including the backlight unit, which is an external light source, are described as the embodiments. However, reflection type liquid crystal display devices that use outside light to display images are also included in the scope of the present invention. The reflection type liquid crystal display devices do not require backlight units.

(19) Each of the above embodiments includes the TFTs as switching components of the liquid crystal display device. However, liquid crystal display devices that include switching components other than TFTs (e.g., thin film diodes (TFDs)) may be included in the scope of the present invention. Furthermore, black-and-white liquid crystal display devices, other than color liquid crystal display device, are also included in the scope of the present invention.

(20) The liquid crystal display devices including the liquid crystal panels as the display panels are described as the embodiments. However, display devices that include other types of display panels (e.g., plasma display panels (PDPs) and organic EL panels) are also included in the scope of the present invention. Such display devices do not require backlight units.

(21) The above embodiments include the liquid crystal panels that are classified as small sized or small to middle sized panels. Such liquid crystal panels are used in electronic devices including PDAs, mobile phones, notebook computers, digital photo frames, portable video games, and electronic ink papers. However, liquid crystal panels that are classified as middle sized or large sized (or supersized) panels having screen sizes from 20 inches to 90 inches are also included in the scope of the present invention. Such display panels may be used in electronic devices including television devices, digital signage, and electronic blackboard.

EXPLANATION OF SYMBOLS

11: liquid crystal panel (display panel), 11a: CF board (counter substrate), 11b, 311b: array board (semiconductor device), 11c: liquid crystal layer, 17: TFT (switching component), 19: gate line (signal line), 25, 225: common line (static dissipating line), 29, 129, 229: first diode (semiconductor component), 29a, 229a: one of first electrodes (one of electrodes), 29b, 129b, 229b: the other one of the first electrodes (another electrode), 29c, 229c: first protection portion (a protection portion), 29d, 129d: first semiconductor portion (semiconductor portion), 29e, 129e: gate electrode (gate electrode), 30, 130, 230: second diode (second semiconductor component), 30a, 130a, 230a: one of second electrodes (one of second electrode), 30b, 230b: the other one of the second electrodes (another second electrode), 30c, 230c: second protection portion (second protection portion), 30c1, 30c2, 230c1, 230c2: second diode-side hole (semiconductor component-side hole), 30d, 130d: second semiconductor portion (second semiconductor portion), 30e, 130e: second gate electrode (second gate electrode), 31, 131, 231: first shorting line (semiconductor component-side line), 32, 232: contact portion, 33, 433: second shorting line (second semiconductor component-side line), 34: first metal film, 35: gate insulator (insulation film), 36: semiconductor film, 37: protection film, 38: second metal film, 43: first gate electrode-side insulator (gate electrode-side insulator), 43a, 143a: first gate electrode-side hole (gate electrode-side hole), 45: second gate electrode-side insulator (second gate electrode-side insulator), 45a: second gate electrode-side hole (second gate electrode-side hole), 46, 146: common line-side connecting portion (static dissipating line-side connecting portion), 47: second shorting line-side insulator (second semiconductor component connecting line-side insulator), 47a: second shorting line-side hole (second semiconductor connecting line-side hole), 48, 248: gate line-side connecting portion (signal line-side connecting portion), 49: contact portion-side insulator, 49a, 249a: contact portion-side hole, 50, 250: diode-side connecting portion (semiconductor component-side connecting portion), 51, 251, 351, 551: static protection portion, 52, 252, 352, 452: static dissipating portion, 52a, 52c, 52d, 452c, 452d: outer edge, 53, 253, 453, 553: second static dissipating portion, 54a, 54b, 55a, 454a, 454b: outer edge, 56: static dissipating projection, 57: first gate non-overlapping-type static dissipating portion (gate non-overlapping-type static dissipating portion), 57b: outer edge, 129b1: outer edge, CP2, CP2, CP3: intersection, CPT: intersection, GS: glass substrate (substrate)

The invention claimed is:

1. A semiconductor device comprising:
a substrate;
a first metal film formed on the substrate, the first metal film forming a static dissipating line;
an insulation film formed on at least the first metal film;
a semiconductor film formed on the insulation film, the semiconductor film forming a semiconductor portion of a semiconductor component;
a protection film formed on at least the semiconductor film and protecting the semiconductor film, the protection film forming a protection portion of the semiconductor component; and
a second metal film formed on the protection film, the second metal film forming two electrodes of the semiconductor component and a semiconductor component connecting line, wherein the protection portion of the semiconductor component includes two semiconductor component-side holes that are through holes formed at positions overlapping the electrodes, respectively,
the semiconductor portion of the semiconductor component is connected to the electrodes via the semiconductor component-side holes, respectively, and includes outer edges that cross outer edges of the electrodes in a plan view,
the static dissipating line is arranged adjacent to the semiconductor component in a plan view, extends along a plate surface of the substrate and along a direction that crosses an arrangement direction of the electrodes, and is configured to dissipate static,
the semiconductor component connecting line continues from one of the electrodes, and extends along the plate surface of the substrate and along the arrangement direction of the electrodes so as to cross the static dissipating line,
one of the second metal film and the semiconductor film forms a static dissipating portion of a static protection portion, and
the static dissipating portion is arranged closer to the semiconductor component than an intersection of the static dissipating line and the semiconductor component connecting line such that at least a portion of the static dissipating portion overlaps the static dissipating line in a plan view, and configured to dissipate static.

2. The semiconductor device according to claim 1, wherein the semiconductor film is made of oxide semiconductor.

3. The semiconductor device according to claim 1, wherein the semiconductor film forms the static dissipating portion.

4. The semiconductor device according to claim 3, wherein the static protection portion includes a second static dissipating portion formed from the second metal film, arranged such that at least a portion thereof overlaps the static dissipating portion in a plan view, and including outer edges that cross outer edges of the static dissipating portion.

5. The semiconductor device according to claim 4, wherein
the static dissipating portion has a rectangular shape in a plan view, and
the second static dissipating portion is arranged such that the outer edges thereof cross the outer edges of the static dissipating portion at least at four points.

6. The semiconductor device according to claim 5, wherein the second static dissipating portion includes at least four outer edges parallel to four outer edges of the static dissipating portion, respectively, and a distance between the outer edges thereof parallel to each other is different from a distance between the outer edges of the static dissipating portion parallel to each other.

7. The semiconductor device according to claim 1, wherein
the second metal film forms a second semiconductor component connecting line that continues from another one of the electrodes of the semiconductor component;
the insulation film and the protection film form a second semiconductor component connecting line-side insulator that includes a second semiconductor component connecting line-side hole that is a through hole formed at a position overlapping the second semiconductor component connecting line in a plan view; and the first metal film forms a static dissipating line-side connecting portion that continues from the static dissipating line, the static dissipating line-side connecting portion is arranged such that at least a portion thereof overlaps the second semiconductor component connecting line in a plan view and connected to the second semiconductor component connecting line via the second semiconductor component connecting line-side hole.

8. The semiconductor device according to claim 7, wherein the second metal film forms two second electrodes of a second semiconductor component, the protection film forms a second protection portion of the second semiconductor component, the second protection portion includes two second semiconductor component-side holes that are through holes formed at positions overlapping the second electrodes, the semiconductor film forms a second semiconductor portion of the second semiconductor component, the second semiconductor portion is connected to the second electrodes via the second semiconductor component-side holes, respectively, the semiconductor component connecting line shorts out one of the electrodes to one of the second electrodes, and the second semiconductor component connecting line shorts out the other one of the electrodes to the other one of the second electrodes.

9. The semiconductor device according to claim 8, wherein the protection film and the insulation film form a gate electrode-side insulator that includes a gate electrode-side hole that is a through hole formed at a position overlapping the semiconductor component connecting line, the first metal film forms a gate electrode of the semiconductor component, the gate electrode is arranged so as to overlap at least portions of the electrodes, the semiconductor portion, and the semiconductor component connecting line in a plan view, and connected to the semiconductor component connecting line via the gate electrode-side hole, the protection film and the insulation film form a second gate electrode-side insulator, the second gate electrode-side insulator includes a second gate electrode-side hole that is a through hole formed at a position overlapping the semiconductor component connecting line, the first metal film form a second gate electrode of the second semiconductor component, the second gate electrode is arranged so as to overlap at least portions of the second electrodes, the second semiconductor portion, and the second semiconductor component connecting line in a plan view, and the second gate electrode is connected to the second semiconductor component connecting line via the second gate electrode-side hole.

10. The semiconductor device according to claim 1, wherein the first metal film forms a signal line that is arranged on an opposite side from the static dissipating line with respect to the semiconductor component, the first metal film forms a signal line-side connecting portion at an end of the signal line;

the protection film and the insulation film form a contact portion-side insulator that includes a contact portion-side hole that is a through hole formed at a position overlapping the signal line-side connecting portion, and the second metal film forms a contact portion that includes at least a semiconductor component-side connecting portion formed at an end of the semiconductor component connecting line so as to overlap the signal line-side connecting portion in a plan view and connected to the signal line-side connecting portion via the contact portion-side hole.

11. The semiconductor device according to claim 10, wherein the first metal film forms static dissipating projections at portions of the signal line-side connecting portion in the contact portion and the static dissipating line opposed to each other so as to project toward each other to dissipate static.

12. The semiconductor device according to claim 1, wherein the protection film and the insulation film form a gate electrode-side insulator that includes a gate electrode-side hole that is a through hole formed at a position overlapping the semiconductor component connecting line, the first metal film forms a gate electrode included in the semiconductor component, the gate electrode is arranged so as to overlap at least portions of the electrodes, the semiconductor portion, and the semiconductor component connecting line in a plan view, and connected to the semiconductor component connecting line via the gate electrode-side hole, and the semiconductor film forms a gate non-overlapping-type static dissipating portion that continues from the semiconductor portion and includes an outer edge that crosses an outer edge of the other one of the electrodes in a plan view at a position that does not overlap the gate electrode in a plan view.

13. A display device comprising:
the semiconductor device according to claim 1;
a counter substrate arranged opposite the semiconductor device;
a liquid crystal layer arranged between the semiconductor device and the counter substrate; and
a switching component included in the semiconductor device and connected to at least the semiconductor component.

14. The semiconductor device according to claim 2, wherein the oxide semiconductor contains indium, gallium, and zinc.

15. A method of fabricating a semiconductor device, the method comprising:
forming a first metal film on a substrate;
forming an insulation film on at least the first metal film;
forming a semiconductor film on the insulation film;
forming a protection film on at least the semiconductor film to protect the semiconductor film;
forming a second metal film on the protection film;
forming two electrodes of a semiconductor component from the second metal film;
forming a protection portion from the protection film;
forming two semiconductor component-side holes in the protection portion at positions overlapping the electrodes, respectively, the semiconductor component-side holes being through holes;
forming a semiconductor portion from the semiconductor film such that outer edges of the semiconductor portion cross outer edges of the electrodes in a plan view;

connecting the semiconductor portion to the electrodes via the semiconductor component-side holes, respectively;

forming a static dissipating line from the first metal film adjacent to the semiconductor component in a plan view so as to extend along a plate surface of the substrate and along a direction that crosses an arrangement direction of the electrodes to dissipate static;

forming a semiconductor component connecting line from the second metal film so as to continue from one of the electrodes and to extend along the plate surface of the substrate and along the arrangement direction of the electrodes so as to cross the static dissipating line; and forming a static dissipating portion of a static protection portion from one of the second metal film and the semiconductor film at a position closer to the semiconductor component than an intersection of the static dissipating line and the semiconductor component connecting line such that at least a portion of the static dissipating portion overlaps the static dissipating line in a plan view to dissipate static.

16. The method according to claim 15 further comprising:

forming a second semiconductor component connecting line from the second metal film so as to continue from another one of the electrodes of the semiconductor component;

forming a second semiconductor component connecting line-side insulator from the insulation film and the protection film;

forming a second semiconductor component connecting line-side hole in the second semiconductor component connecting line-side insulator at a position overlapping the second semiconductor component connecting line in a plan view, the second semiconductor component connecting line-side hole being a through hole;

forming a static dissipating line-side connecting portion from the first metal film so as to continue from the static dissipating line such that at least a portion of the static dissipating line-side connecting portion overlaps the second semiconductor component connecting line in a plan view; and connecting the static dissipating line-side connecting portion to the second semiconductor connecting line via the second semiconductor component connecting line-side hole.

17. The method according to claim 16 further comprising preparing the semiconductor film from an oxide semiconductor.

18. The method according to claim 17 wherein the oxide semiconductor contains indium, gallium, and zinc.

19. The method according to claim 15 further comprising:

forming a signal line from the from the first metal film on an opposite side from the static dissipating line with respect to the semiconductor component;

forming a signal line-side connecting portion at an end of the signal line;

forming a contact portion-side insulator from the protection film and the insulation film;

forming a contact portion-side hole in the contact portion-side insulator at a position overlapping the signal line-side connecting portion, the contact portion-side hole being a through hole;

forming a contact portion from the second metal film;

forming a semiconductor component-side connecting portion at an end of the semiconductor component connecting line so as to overlap the signal line-side connecting portion in a plan view; and connecting the semiconductor component-side connecting portion to the signal line-side connecting portion via the contact portion-side hole.

20. The method according to claim 15 further comprising:

forming a gate electrode-side insulator from the protection film and the insulation film;

forming a gate electrode-side hole in the gate electrode-side insulator at a position overlapping the semiconductor component connecting line, the gate electrode-side hole being a through hole;

forming a gate electrode of the semiconductor component from the first metal film so as to overlap at least portions of the electrodes, the semiconductor portion, and the semiconductor component connecting line in a plan view; and connecting the gate electrode of the semiconductor component connecting line via the gate electrode-side hole;

forming a gate non-overlapping-type static dissipating portion so as to continue from the semiconductor portion such that an outer edge of the gate non-overlapping-type static dissipating portion crosses an outer edge of the other one of the electrodes in a plan view at a position that does not overlap the gate electrode in a plan view.

* * * * *